United States Patent
Kardasz et al.

(10) Patent No.: US 12,075,706 B2
(45) Date of Patent: Aug. 27, 2024

(54) PRECESSIONAL SPIN CURRENT STRUCTURE WITH NON-MAGNETIC INSERTION LAYER FOR MRAM

(71) Applicant: Integrated Silicon Solution, (Cayman) Inc., Grand Cayman (KY)

(72) Inventors: Bartlomiej Adam Kardasz, Pleasanton, CA (US); Mustafa Michael Pinarbasi, Morgan Hill, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 165 days.

(21) Appl. No.: 17/665,601

(22) Filed: Feb. 7, 2022

(65) Prior Publication Data

US 2022/0165942 A1 May 26, 2022

Related U.S. Application Data

(60) Continuation of application No. 16/821,656, filed on Mar. 17, 2020, now Pat. No. 11,271,149, which is a
(Continued)

(51) Int. Cl.
*H10N 50/01* (2023.01)
*G11C 11/16* (2006.01)
(Continued)

(52) U.S. Cl.
CPC ........... *H10N 50/01* (2023.02); *G11C 11/161* (2013.01); *H10N 50/10* (2023.02); *H10N 50/85* (2023.02)

(58) Field of Classification Search
CPC ......... H01L 43/02; H01L 43/08; H01L 43/10; H01L 43/12; H01L 29/66984;
(Continued)

(56) References Cited

U.S. PATENT DOCUMENTS 6,376,260 B1  4/2002  Chen et al.
2005/0259463 A1  11/2005  Lim
(Continued)

FOREIGN PATENT DOCUMENTS

CN   101162756 A   4/2008
JP   2001-068761 A  3/2001
(Continued)

OTHER PUBLICATIONS

KR Patent App. No. 10-2019-7028383, Office Action Dated Feb. 17, 2022, with English translation, 13 pages.
(Continued)

*Primary Examiner* — Nelson Garces

(57) ABSTRACT

A magnetoresistive random-access memory (MRAM) is disclosed. MRAM device has a magnetic tunnel junction stack having a significantly improved performance of the free layer in the magnetic tunnel junction structure. The MRAM device utilizes a precessional spin current (PSC) magnetic structure in conjunction with a perpendicular MTJ where the in-plane magnetization direction of the PSC magnetic layer is free to rotate. The precessional spin current magnetic layer a first and second precessional spin current ferromagnetic layer separated by a nonmagnetic precessional spin current insertion layer.

20 Claims, 16 Drawing Sheets

Related U.S. Application Data division of application No. 15/445,362, filed on Feb. 28, 2017, now Pat. No. 10,665,777.

(51) Int. Cl.
*H10N 50/10* (2023.01)
*H10N 50/85* (2023.01)

(58) Field of Classification Search
CPC ........ G11C 11/161; H01F 10/32–3295; H03B 15/006; G02F 2203/16; H10N 50/10; H10N 50/85
See application file for complete search history.

(56) References Cited

U.S. PATENT DOCUMENTS

| | | |
|---|---|---|
| 2006/0012926 A1 | 1/2006 | Parkin |
| 2007/0215967 A1 | 9/2007 | Wu et al. |
| 2008/0140922 A1 | 6/2008 | Higo et al. |
| 2009/0180312 A1* | 7/2009 | Miura .................... H10B 61/10 365/158 |
| 2009/0244792 A1* | 10/2009 | Nakayama ............. H10N 50/10 360/324.11 |
| 2013/0070522 A1* | 3/2013 | Saida .................... H10N 50/10 365/173 |
| 2013/0077391 A1 | 3/2013 | Luo et al. |
| 2013/0163316 A1 | 6/2013 | Higo et al. |
| 2014/0242418 A1 | 8/2014 | Shukh |
| 2015/0129997 A1* | 5/2015 | Tang .................... G11C 11/161 257/427 |
| 2015/0325783 A1* | 11/2015 | Wang .................... H01F 41/302 257/421 |
| 2016/0372656 A1 | 12/2016 | Pinarbasi et al. |
| 2017/0018705 A1* | 1/2017 | Harms .................. H10N 50/10 |

FOREIGN PATENT DOCUMENTS

| | | |
|---|---|---|
| JP | 2004-207707 A | 7/2004 |
| JP | 2008-147522 A | 6/2008 |
| JP | 2009-231753 A | 10/2009 |
| JP | P2013-115300 A | 6/2013 |

OTHER PUBLICATIONS

JP Patent App. No. 2019-546791, Office Action Dated Jun. 14, 2022, with English translation, 4 pages.
CN Patent App. No. 2018800217753, Office Action Dated Mar. 9, 2023, with English translation, 17 pages.

* cited by examiner

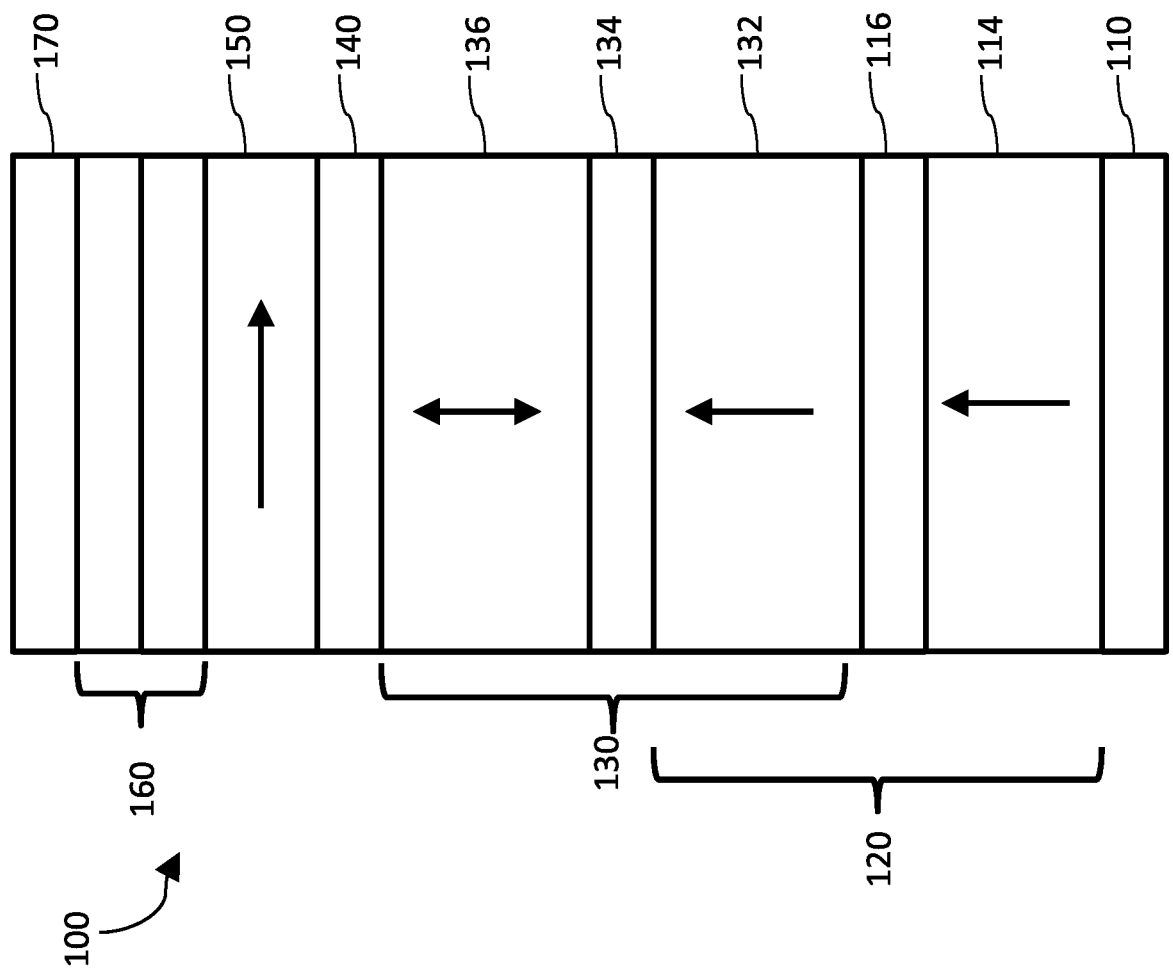

VSM For Magnetic Field Applied Perpendicular To Plane

VSM For Magnetic Field Applied In-Plane

PRECESSIONAL SPIN CURRENT STRUCTURE WITH NON-MAGNETIC INSERTION LAYER FOR MRAM

CROSS-REFERENCE TO RELATED APPLICATIONS

This application is a continuation of U.S. patent application Ser. No. 16/821,656, entitled "PRECESSIONAL SPIN CURRENT STRUCTURE WITH NON-MAGNETIC INSERTION LAYER FOR MRAM," filed Mar. 17, 2020, now U.S. Pat. No. 11,271,149 issued Mar. 8, 2022, which is a divisional application of U.S. patent application Ser. No. 15/445,362, entitled "PRECESSIONAL SPIN CURRENT STRUCTURE WITH NON-MAGNETIC INSERTION LAYER FOR MRAM," filed Feb. 28, 2017, now U.S. Pat. No. 10,665,777, issued May 26, 2020. Priority to these applications is expressly claimed, and the disclosures of these applications are incorporated herein by reference in their entireties.

FIELD

The present patent document relates generally to spin-transfer torque magnetic random access memory and, more particularly, to a magnetic tunnel junction stack having improved performance of the free layer in the magnetic tunnel junction structure through use of a precessional spin current structure having in-plane anisotropy through use of ferromagnetic materials and a nonmagnetic spacer layer.

BACKGROUND

Magnetoresistive random-access memory ("MRAM") is a non-volatile memory technology that stores data through magnetic storage elements. These elements are two ferromagnetic plates or electrodes that can hold a magnetization and are separated by a nonmagnetic material, such as a nonmagnetic metal or insulator. In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer. The insulator between the reference layer and the free layer enables tunneling of electrons from the free layer to the reference layer.

MRAM devices store information by changing the orientation of the magnetization of the free layer. In particular, based on whether the free layer is in a parallel or anti-parallel alignment relative to the reference layer, either a "1" or a "0" can be stored in each MRAM cell. Due to the spin-polarized electron tunneling effect, the electrical resistance of the cell change due to the orientation of the magnetization of the two layers. The cell's resistance will be different for the parallel and anti-parallel states and thus the cell's resistance can be used to distinguish between a "1" and a "0". One important feature of MRAM devices is that they are non-volatile memory devices, since they maintain the information even when the power is off. The two plates can be sub-micron in lateral size and the magnetization direction can still be stable with respect to thermal fluctuations.

Spin transfer torque or spin transfer switching, uses spin-aligned ("polarized") electrons to change the magnetization orientation of the free layer in the magnetic tunnel junction. In general, electrons possess a spin, a quantized number of angular momentum intrinsic to the electron. An electrical current is generally unpolarized, i.e., it consists of 50% spin up and 50% spin down electrons. Passing a current through a magnetic layer polarizes electrons with the spin orientation corresponding to the magnetization direction of the magnetic layer (i.e., polarizer), thus producing a spin-polarized current. If a spin-polarized current is passed to the magnetic region of a free layer in the magnetic tunnel junction device, the electrons will transfer a portion of their spin-angular momentum to the magnetization layer to produce a torque on the magnetization of the free layer. Thus, this spin transfer torque can switch the magnetization of the free layer, which, in effect, writes either a "1" or a "0" based on whether the free layer is in the parallel or anti-parallel states relative to the reference layer.

FIG. 1 illustrates a magnetic tunnel junction ("MTJ") stack 100 for a conventional MRAM device. As shown, stack 100 includes one or more seed layers 110 provided at the bottom of stack 100 to initiate a desired crystalline growth in the above-deposited layers. Furthermore, MTJ 130 is deposited on top of SAF layer 120. MTJ 130 includes reference layer 132, which is a magnetic layer, a nonmagnetic tunneling barrier layer (i.e., the insulator) 134, and the free layer 136, which is also a magnetic layer. It should be understood that reference layer 132 is actually part of SAF layer 120, but forms one of the ferromagnetic plates of MTJ 130 when the nonmagnetic tunneling barrier layer 134 and free layer 136 are formed on reference layer 132. As shown in FIG. 1, magnetic reference layer 132 has a magnetization direction perpendicular to its plane. As also seen in FIG. 1, free layer 136 also has a magnetization direction perpendicular to its plane, but its direction can vary by 180 degrees.

The first magnetic layer 114 in the SAF layer 120 is disposed over seed layer 110. SAF layer 120 also has an antiferromagnetic coupling layer 116 disposed over the first magnetic layer 114. Furthermore, a nonmagnetic spacer 140 is disposed on top of MTJ 130 and a polarizer 150 is disposed on top of the nonmagnetic spacer 140. Polarizer 150 is a magnetic layer that has a magnetic direction in its plane, but is perpendicular to the magnetic direction of the reference layer 132 and free layer 136. Polarizer 150 is provided to polarize a current of electrons ("spin-aligned electrons") applied to MTJ structure 100. Further, one or more capping layers 160 can be provided on top of polarizer 150 to protect the layers below on MTJ stack 100. Finally, a hard mask 170 is deposited over capping layers 160 and is provided to pattern the underlying layers of the MTJ structure 100, using a reactive ion etch (ME) process.

Various mechanisms have been proposed to assist the free-layer magnetization switching in magnetic tunnel junction (MTJ) devices such as orthogonal spin transfer for in-plane magnetic tunnel junctions. One issue has been that to realize the orthogonal spin transfer effect for in-plane MTJ structures, large spin currents may be required for switching. The need for large switching currents may limit such device's commercial applicability. One way proposed to reduce switching current is to lower the magnetization of the free layer. However, if the effective magnetization of the free layer is lowered significantly, the orthogonal effect has to be limited so that the free-layer does not go into precessional mode that would make the end state of the free-layer magnetization un-deterministic. This defines the operation window for the in-plane OST structures. In an in-plane device, unlike that shown in FIG. 1, the magnetization direction of the reference layer and free layer are in the plane of the layer. Another aspect of in-plane devices is that the thermal stability requirements may limit the size of the MTJ devices to approximately sixty nanometers or higher.

For perpendicular MTJ structures such as those shown in FIG. 1, the precession is not an issue. The orthogonal polarizer acts on the free layer magnetization at the initial state, but when the precession takes hold, the fixed orthogonal polarizer 150 helps only half the cycle of the free-layer magnetization rotation while it harms the other half of the cycle. This is demonstrated with reference to FIGS. 2A-2B and 3. FIGS. 2A-2B shows switching of a free layer 136 of an MTJ. As is seen, free layer 136 has a magnetization direction 200 perpendicular to that of the polarizer 150. The magnetization direction 200 of the free layer 136 can rotate by 180 degrees. FIGS. 2A-2B show precession about the axis of the magnetization vector of free layer 136. During precession, magnetic vector 200 begins to rotate about its axis in a cone-like manner such that its magnetization vector 200' deflects from the perpendicular axis 202 of free layer 136. For an ideal case, prior to initiating precession, no component of magnetic vector 200 is in the plane of free layer 136, once precession starts, a component of magnetic vector 200' can be found both in-plane and orthogonal to free layer 136. As magnetic vector 200' continues to precess (i.e., switch), the rotation of vector 200' extends further from the center of free layer 136, as is seen in FIG. 2B.

In prior MTJ devices using a polarizer such as polarizer 150, the magnetization direction of polarizer 150 is fixed, which is shown in FIGS. 1 and 3. See also U.S. Pat. No. 6,532,164, which states that the direction of the magnetization of the polarizing layer cannot vary in the presence of current. Prior to current passing through the MTJ, the free layer 136 has a magnetization direction 200 substantially perpendicular to that of the polarizer 150. While the magnetization direction 200 of the free layer 136 can rotate by 180 degrees, such rotation is normally precluded by the free layer's inherent damping ability 205, which is represented by a vector 205 pointing to axis 202 (shown as a dashed line in FIG. 2A as well as FIG. 3). Axis 202 is perpendicular to the plane of free layer 136. This damping 205 has a value, defined by the damping constant, which maintains the magnetization direction of the free layer 136.

Passing a current through polarizer 150 produces a spin-polarized current, which creates a spin transfer torque 210 in the direction of the polarizer 150 on the magnetization vector 200. This spin transfer torque from the polarizer adds to the main spin transfer torque that causes free layer magnetization direction switching. In devices like those shown in FIG. 1, when the spin transfer torque 210 begins to help overcome the damping 205 inherent to the free layer 136, the magnetic direction 200' begins to precess about its axis, as shown in FIG. 2A. As seen in FIG. 3, spin transfer torque 210 helps the magnetization direction of the free layer 136 to precess in a cone-like manner around an axis 202 perpendicular to the plane of the layers. When a spin polarized current traverses the stack 100, the magnetization of the free layer 136 precesses in a continuous manner (i.e. it turns on itself in a continuous manner as shown in FIG. 3) with maintained oscillations until the magnetic direction of free layer 136 is opposite the magnetic direction prior to the spin torque causing precession, i.e., the magnetic direction of free layer 136 switches by 180 degrees.

FIG. 3 illustrates precession of a free layer 136 of an MTJ assisted by spin polarized current provided by polarizing magnetic layer 150. The spin polarized electrons from polarizer 150 provide torque 210 that helps overcome the damping 205 in the first half of the precession 215 because the torque 210 provided by the spin polarized current is opposite that of the inherent damping 205 of the free layer 136. This is shown on the right-hand side of the middle portion of FIG. 3. However, the spin polarized electrons from polarizer 150 actually harm the switching process during the second half of the precession 220. The reason for this is that the spin of the electrons in the spin polarized current only applies a torque 210 in the direction of their polarization. Thus, when the magnetic vector is in the half of the precession cycle 220 that is opposite the spin of the polarized electrons, the spin transfer torque 210 actually works with the inherent damping 205 of free layer 136 to make rotation more difficult. This is shown in the left-hand side of the middle portion of FIG. 3. Indeed, it is the magnetization vector of the reference layer 132 (not shown in FIG. 3) that overcomes the damping of free layer 136 as well as the spin transfer torque 210 during the half of a precession cycle where the spin of the electrons harms precession, and thus it is the reference layer 132 that allows for completion of precession.

In these prior devices, because magnetization direction of polarizer 150 is fixed, once the precession holds, it has no positive effect on the switching mechanism for a full one-hundred eighty degree precession. This is because polarized electrons will help the spin transfer torque the most when all vectors are closely aligned.

U.S. patent application Ser. No. 14/814,036, filed by the same Applicant as the present patent document, discloses an MRAM device having a precessional spin current ("PSC") magnetic layer that is physically separated from the free magnetic layer of a magnetic tunnel junction and which is coupled to the free magnetic layer by a nonmagnetic spacer. In the device described in this co-pending application, the magnetization direction of the precessional spin current magnetic layer follows precession of the magnetization direction of the free magnetic layer, thereby causing spin transfer torque to assist switching of the magnetization vector of the free magnetic layer. The disclosure of U.S. patent application Ser. No. 14/814,036 is incorporated by reference in its entirety.

The performance of an MRAM device using a single ferromagnetic layer for the precessional spin current magnetic layer varies based on its thickness and the choice of materials. The ability to vary the thickness of the precessional spin current magnetic layer is important because thickness can affect the influence of the precessional spin current effect on switching of the free layer of the magnetic tunnel junction. The same is true for material selection. Indeed, thickness and material selection impact spin torque efficiency of the PSC structure as well as the coupling strength between the PSC structure and the free layer.

The magnetic moment of in-plane ferromagnetic precessional spin current magnetic layer has to be significant in order to develop sufficient spin polarization of current passing there through. The required exchange coupling between the precessional spin current magnetic layer and the free layer of the magnetic tunnel junction needed to achieve a precession of the precessional spin current magnetic layer with the free layer may also require a narrow window of exchange coupling strength. Additionally a dipolar field produced by the close proximity of in-plane PSC layer to the free layer can cause a decrease in the stability of the free layer due to strong magneto-static coupling. The various embodiments described herein overcome these issues.

SUMMARY

A precessional spin current structure for an MRAM device having a magnetic tunnel junction stack is disclosed.

In an embodiment, a magnetic device includes a first synthetic antiferromagnetic structure in a first plane. The first synthetic antiferromagnetic structure includes a magnetic reference layer. The magnetic reference layer has a magnetization vector that is perpendicular to the first plane and has a fixed magnetization direction. An embodiment also includes a nonmagnetic tunnel barrier layer in a second plane and disposed over the magnetic reference layer. An embodiment includes a free magnetic layer in a third plane and disposed over the nonmagnetic tunnel barrier layer. The free magnetic layer has a magnetization vector that is perpendicular to the third plane and has a magnetization direction that can precess from a first magnetization direction to a second magnetization direction. The magnetic reference layer, the nonmagnetic tunnel barrier layer and the free magnetic layer form a magnetic tunnel junction. An embodiment also includes a nonmagnetic spacer layer in a fourth plane and disposed over the free magnetic layer. The magnetic coupling layer comprises MgO. An embodiment also includes a precessional spin current magnetic structure in a fifth plane that is physically separated from the free magnetic layer and coupled to the free magnetic layer by the nonmagnetic spacer layer. The precessional spin current magnetic structure has a magnetization vector with a magnetization direction in the fifth plane which can freely rotate in any magnetic direction in the fifth plane. The precessional spin current magnetic structure comprises a first precessional spin current ferromagnetic layer, a nonmagnetic precessional spin current insertion layer and a second precessional spin current ferromagnetic layer. The first precessional spin current ferromagnetic layer can be disposed over the nonmagnetic spacer layer. The nonmagnetic precessional spin current insertion layer can be disposed over the first precessional spin current ferromagnetic layer. The second precessional spin current ferromagnetic layer can be disposed over the nonmagnetic precessional spin current insertion layer. In an embodiment, the magnetic devices further include a capping layer in a sixth plane and disposed over the precessional spin current magnetic structure. In an embodiment, electrons of an electrical current passing through the precessional spin current magnetic structure are aligned in the magnetic direction of the precessional spin current magnetic layer and injected into the nonmagnetic spacer, the free magnetic layer, the nonmagnetic tunnel barrier layer, and the magnetic reference layer, and wherein the magnetization direction of the precessional spin current magnetic structure precesses, thereby causing spin transfer torque to assist switching of the magnetization vector of the free magnetic layer.

In an embodiment of the magnetic device, the nonmagnetic precessional spin current insertion layer is constructed of a material having a spin diffusion length exceeding two (2) nanometers.

In an embodiment of the magnetic device, the nonmagnetic precessional spin current insertion layer is constructed of a thin film of Ru.

In an embodiment of the magnetic device, the thin film of Ru has a thickness of at least one nanometer.

In an embodiment of the magnetic device, the thin film of Ru has a thickness of 1.5 nanometers.

In an embodiment of the magnetic device, the first precessional spin current ferromagnetic layer comprises a thin film of Fe. The nonmagnetic precessional spin current insertion layer comprises a material with a long spin diffusion length. The second precessional spin current ferromagnetic layer comprises a thin film of CoFeB.

In an embodiment of the magnetic device, the thin film of Fe has a thickness of 0.4 nanometers.

In an embodiment of the magnetic device, the thin film of Fe has a thickness of 0.6 nanometers.

In an embodiment of the magnetic device, the thin film of CoFeB is comprised of forty percent Co, forty percent Fe and twenty percent B.

In an embodiment of the magnetic device, the thin film of CoFeB has a thickness of 1.7 nanometers.

In an embodiment of the magnetic device, the thin film of CoFeB has a thickness of 1.85 nanometers.

In an embodiment of the magnetic device, the material with a long spin diffusion length is selected from the group consisting of Ru, Cu, Ag, Au, Mg and Al.

In an embodiment of the magnetic device, the free magnetic layer has an effective magnetic anisotropy such that its easy axis magnetization axis points away from the perpendicular direction and forms an angle with respect to perpendicular plane.

In an embodiment, a precessional spin current magnetic structure in a first plane, the precessional spin current magnetic structure having a magnetization vector with a magnetization direction in the first plane which can freely rotate in any magnetic direction in the first plane, the precessional spin current magnetic structure comprising a first precessional spin current ferromagnetic layer, a nonmagnetic precessional spin current insertion layer and a second precessional spin current ferromagnetic layer, the nonmagnetic precessional spin current insertion layer being disposed over the first precessional spin current ferromagnetic layer, and the second precessional spin current ferromagnetic layer being disposed over the nonmagnetic precessional spin current insertion layer, wherein the nonmagnetic precessional spin current insertion layer is constructed of a thin film of Ru or another nonmagnetic material having a long spin diffusion length; a nonmagnetic spacer layer in a second plane and disposed over the precessional spin current magnetic structure, the non-magnetic spacer layer comprising MgO; a free magnetic layer in a third plane and disposed over the nonmagnetic spacer layer, the free magnetic layer having a magnetization vector that is perpendicular to the third plane and having a magnetization direction that can precess from a first magnetization direction to a second magnetization direction; a nonmagnetic tunnel barrier layer in a fourth plane and disposed over the free magnetic layer; and a synthetic antiferromagnetic structure in a fifth plane, the synthetic antiferromagnetic structure including a magnetic reference layer, the magnetic reference layer having a magnetization vector that is perpendicular to the fifth plane and having a fixed magnetization direction, the magnetic reference layer, the nonmagnetic tunnel barrier layer and the free magnetic layer forming a magnetic tunnel junction.

An embodiment, a method manufacturing a magnetic device is disclosed, which comprises depositing a first synthetic antiferromagnetic structure over a substrate. The first synthetic antiferromagnetic structure is in a first plane and has a magnetization vector that is perpendicular to the first plane and has a fixed magnetization direction. The method includes depositing an exchange coupling layer over the first synthetic antiferromagnetic structure, where the exchange coupling layer is in a second plane. The method also includes depositing a second synthetic antiferromagnetic structure over the substrate. The second synthetic antiferromagnetic structure is in a third plane. The second synthetic antiferromagnetic structure includes a magnetic reference layer. The second synthetic antiferromagnetic structure and the magnetic reference layer have a magnetization vector that is perpendicular to the third plane and has a fixed magnetization direction. The method also includes depositing a nonmagnetic tunnel barrier layer in a fourth plane. The nonmagnetic tunnel barrier is disposed over the magnetic reference layer. The method also includes depositing a free magnetic layer in a fifth plane. The free magnetic layer is disposed over the nonmagnetic tunnel barrier layer and has a magnetization vector that is perpendicular to the fifth plane. The free magnetic layer has a magnetization direction that can precess from a first magnetization direction to a second magnetization direction. The magnetic reference layer, the nonmagnetic tunnel barrier layer and the free magnetic layer form a magnetic tunnel junction. The method also includes depositing a nonmagnetic spacer layer in a sixth plane that is disposed over the free magnetic layer. The method further includes depositing a precessional spin current magnetic structure in a seventh plane that is physically separated from the free magnetic layer and coupled to the free magnetic layer by the nonmagnetic spacer layer. The precessional spin current magnetic structure has a magnetization vector with a magnetization direction in the seventh plane which can freely rotate in any magnetic direction in the seventh plane.

A method of depositing the precessional spin current magnetic structure includes depositing a first precessional spin current ferromagnetic layer. The first precessional spin current ferromagnetic layer is disposed over the nonmagnetic spacer layer. The method further includes depositing a nonmagnetic precessional spin current insertion layer. The nonmagnetic precessional spin current insertion layer is disposed over the first precessional spin current ferromagnetic layer. The method further includes depositing a second precessional spin current ferromagnetic layer. The second precessional spin current ferromagnetic layer is disposed over the nonmagnetic precessional spin current insertion layer.

The method of manufacturing the magnetic device further includes depositing a capping layer in an eighth plane. The capping layer is disposed over the precessional spin current magnetic layer. The method further includes annealing the magnetic device at a temperature of 400 degrees Celsius or greater.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

FIG. 1 illustrates a conventional MTJ stack for an MRAM device.

Figures 2A, 2B:
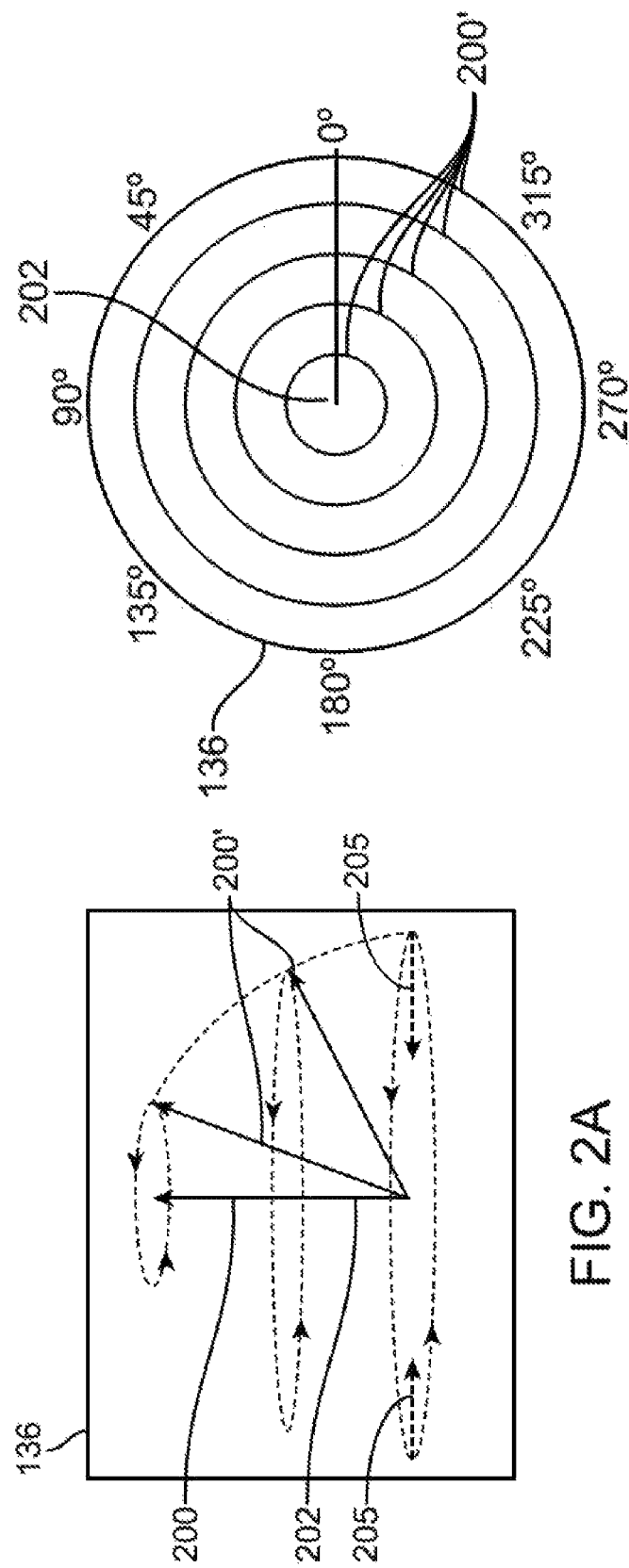
FIGS. 2A-2B illustrate the precession of the free layer in an MTJ.
Figure 3:
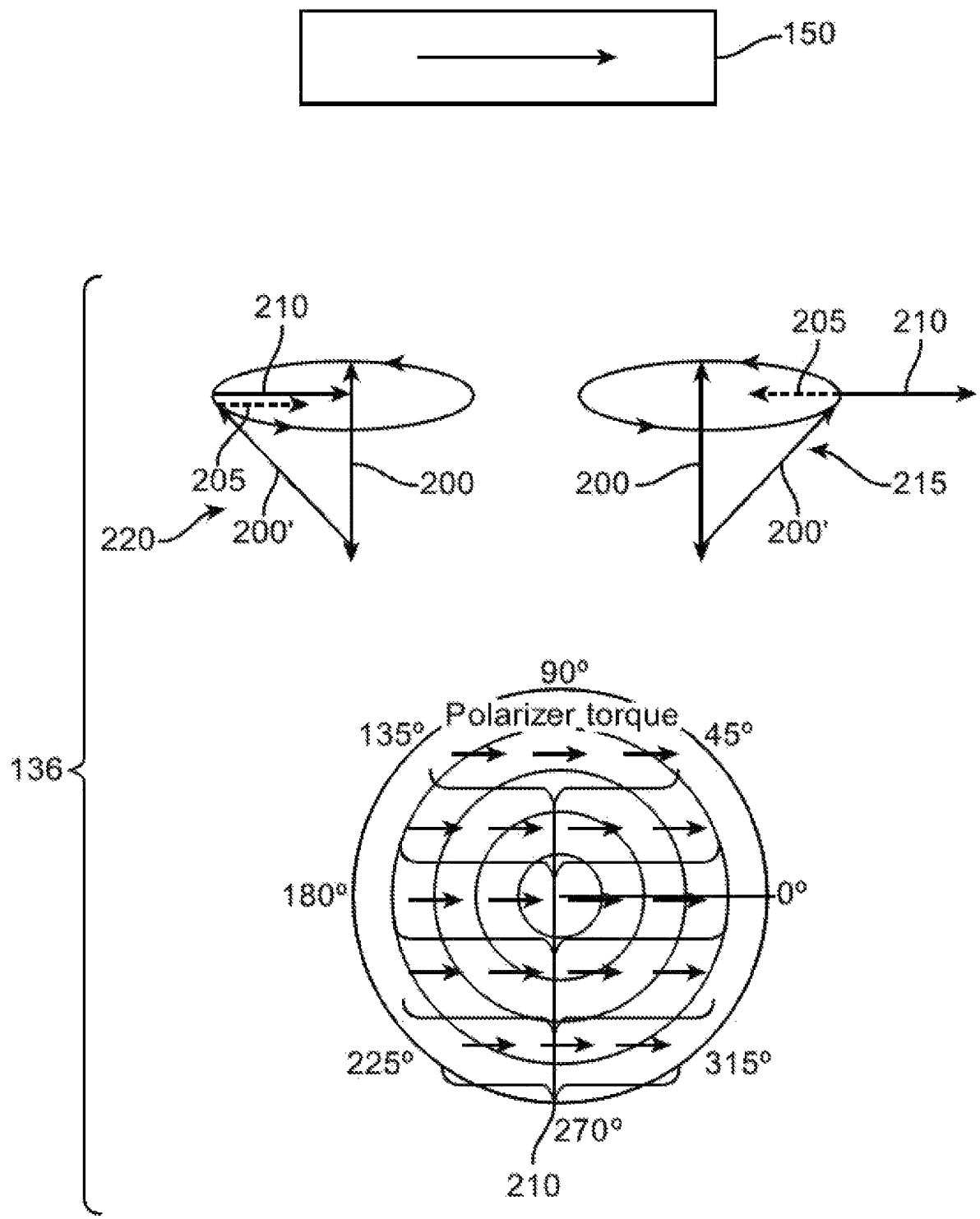
FIG. 3 illustrates the precession of the free layer in an MTJ used with a polarizing magnetic layer having a fixed magnetization direction.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

The following description is presented to enable any person skilled in the art to create and use a precessional spin current structure for a magnetic semiconductor device such as an MRAM device. Each of the features and teachings disclosed herein can be utilized separately or in conjunction with other features to implement the disclosed system and method. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present teachings. However, it will be apparent to one skilled in the art that these specific details are not required to practice the present teachings.

This present patent document discloses a MRAM device that does not use a polarization layer having a fixed magnetization direction. Instead of a polarization layer having a fixed magnetization direction, the MRAM device described in this patent document utilizes a precessional spin current (PSC) magnetic layer 350 in conjunction with a perpendicular MTJ 330 where the in-plane magnetization component direction of the PSC layer is free to rotate (and is shown, for example, in FIG. 4). PSC magnetic layer 350 can rotate with the free-layer magnetization precessional dynamics. This will significantly improve the impact of the spin current in overcoming the inherent damping 205 of the free layer 336 since the PSC layer will help the spin torque overcome this damping through the entire orbital motion of the precession cycle rather on only half of the precession. This precessional spin current effect throughout the entire one-hundred eighty degree rotation significantly enhances the free-layer magnetization switching.

Figure 4:
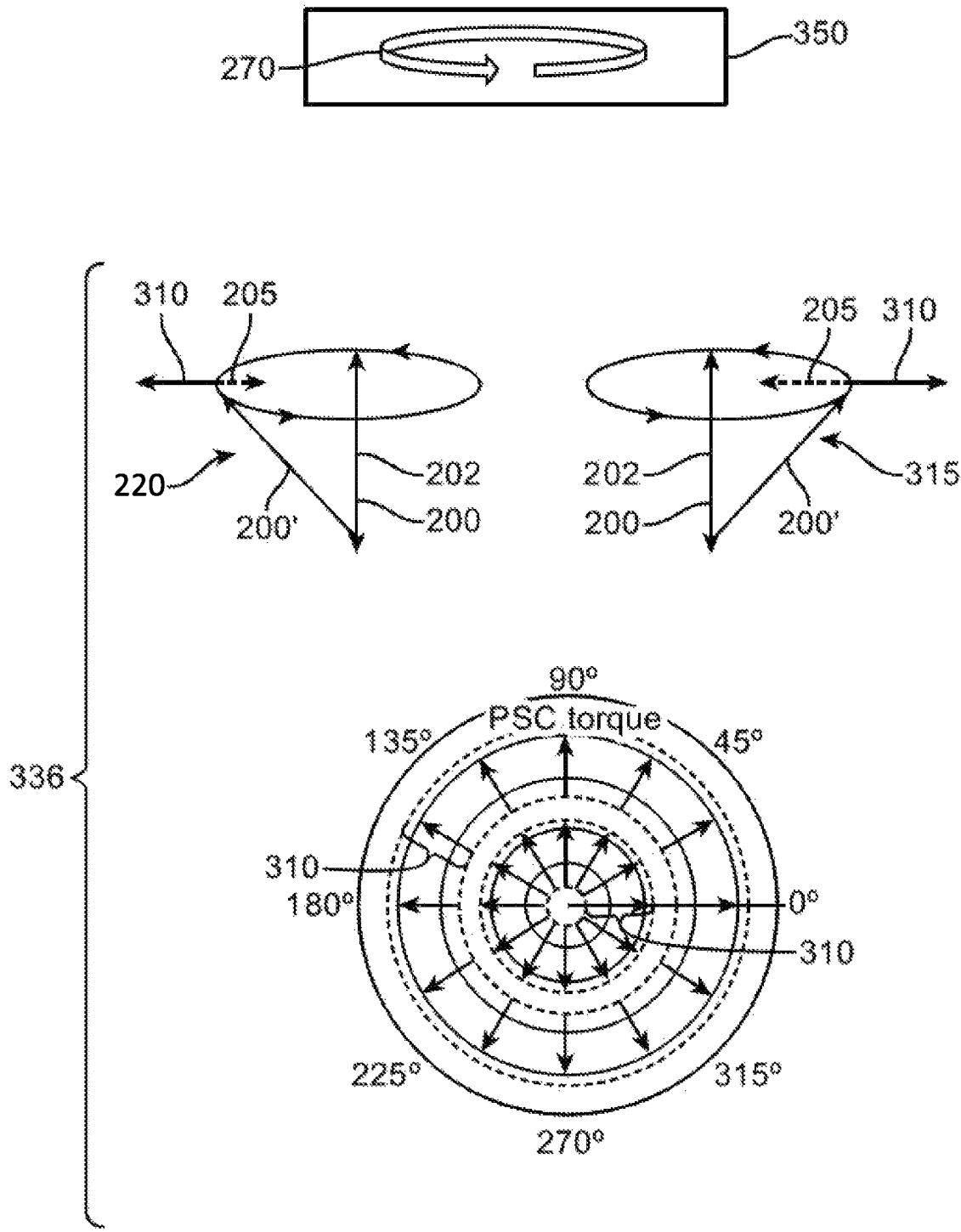
FIG. 4 illustrates the precession of the free layer in an MTJ used with a precessional spin current magnetic layer having a magnetization direction that rotates freely.

FIG. 4 shows the concept behind the MRAM device using a PSC magnetic layer 350 having magnetization vector 270 that rotates instead of a polarization layer 150 having a magnetic vector with a fixed magnetization direction. The free layer 336 in this embodiment is similar to the free layer 136 previously discussed, in that it has an inherent damping characteristic 205 that can be overcome with the assistance of spin transfer torque. However, the embodiment shown in FIG. 4 replaces polarizing layer 150 with PSC magnetic layer 350. As seen in the bottom portion of FIG. 4, the direction of the spin transfer torque 310 created by spin current passing through free layer 336 changes with the rotation of the magnetization direction of PSC magnetic layer 350. As seen in the middle of FIG. 4, spin transfer torque 310 helps the magnetization direction 200' of the free layer 336 to precess in a cone-like manner around an axis 202 perpendicular to the plane of the layers. FIG. 4 shows a progression of rotation of the magnetic direction 200' about axis 202. As discussed, when a spin polarized current traverses the device, the magnetization of the free layer 336 precesses in a continuous manner (i.e. it turns on itself in a continuous manner as shown in FIG. 4) with maintained oscillations until the magnetic direction of free layer 336 is opposite the magnetic direction prior to the spin torque causing precession, i.e., the magnetic direction of free layer 136 switches by 180 degrees. The precessional spin current layer 350 and the free-layer 336 are magnetically and/or electronically coupled such that the magnetization direction of the magnetization vector 270 of the PSC magnetic layer 350 is free to follow the precessional rotation of the magnetic vector of the free layer 336. This can be seen in FIG. 4.

As seen on the right-hand side of FIG. 4, the spin polarized electrons provide torque 310 helps to overcome the damping 205 in the first half of the precession 215 because the torque 310 provided by the spin polarized current is opposite that of the inherent damping 205 of the free layer 336. As discussed, the magnetization direction of magnetization vector 270 of PSC magnetic layer 350 rotates. Thus, the polarization of electrons of the spin current created by PSC magnetic layer 350 changes as well. This means that the direction of torque 310 exerted on magnetic vector of free layer 336 changes as well, which is seen on the bottom of FIG. 4. Thus, unlike prior devices having a fixed polarization magnetic layer 150, the spin of the electrons in the spin polarized current applies a torque 310 in both halves of the precession cycle, including the half of the precession cycle 220 where devices with fixed polarization magnetic layers 150 actually harmed precession. This is seen on the left-hand side of FIG. 4. As is seen, the torque 310 continues to help overcome the inherent damping 205 of free layer 136 throughout the entire precession cycle.

In an embodiment, the precessional vector 270 of the PSC magnetic layer 350 is free to follow the precessional rotation of the magnetic vector of the free layer 336. The magnetization direction of the free layer is switched by the spin torque 310 from the reference layer 132 where the direction of the current defines the final state.

Figure 5:
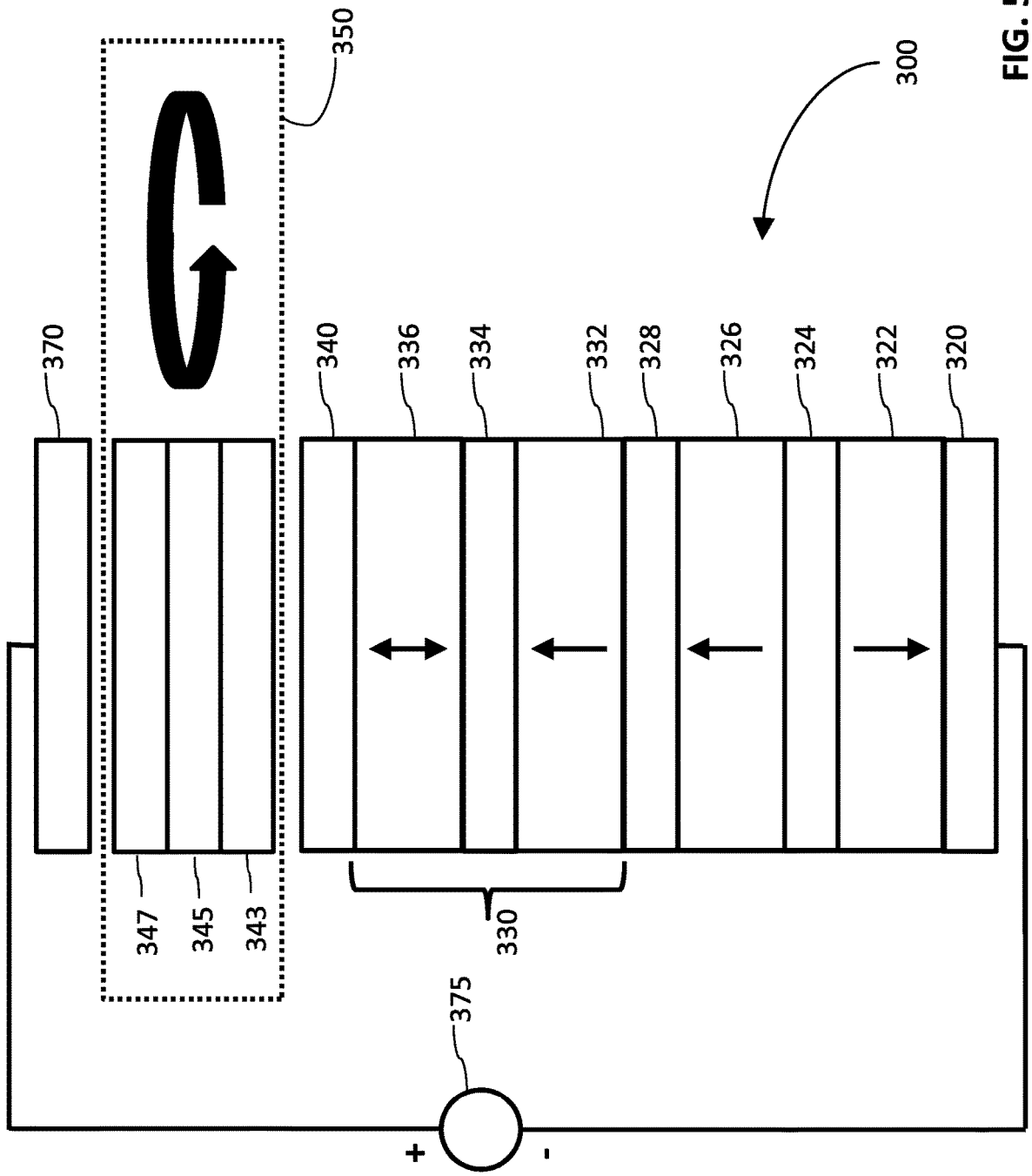
FIG. 5 illustrates an MTJ stack for an embodiment of an MRAM device having a precessional spin current magnetic layer.

A memory cell with a precessional spin current MTJ structure 300 is shown in FIG. 5. The embodiment shown in FIG. 5, as well as all embodiments described herein, is preferably formed on a silicon substrate or other appropriate base for a magnetic device, and can include complementary metal oxide semiconductor (CMOS) circuitry fabricated thereon. MTJ structure 300 includes one or more seed layers 320 provided at the bottom of stack 300 to initiate a desired crystalline growth in the above-deposited layers. A first synthetic antiferromagnetic (SAF) layer 322 is disposed over seed layer 320. As seen in FIG. 5, first SAF layer 322 is a magnetic layer having a magnetization direction that is perpendicular to its plane. Details of the construction of first SAF layer 322 will be discussed below. An anti-ferromagnetic (AFM) coupling layer 324 is disposed over first SAF layer 322. AFM coupling layer 324 is a nonmagnetic layer. A second SAF layer 326 is disposed over AFM coupling layer 324. As seen in FIG. 5, second SAF layer 326 has a magnetic direction that is perpendicular to its plane. In an embodiment, the magnetic direction of first SAF layer 322 and second SAF layer 326 are antiparallel, as is shown in FIG. 5. Details of the construction of second SAF layer 326 will also be discussed below. A ferromagnetic coupling layer 328 is placed over second SAF layer 326. Ferromagnetic coupling layer 328 is a nonmagnetic layer. MTJ 330 is deposited over ferromagnetic coupling layer 328. MTJ 330 includes reference layer 332, tunneling barrier layer (i.e., the insulator) 334 and free layer 336. Reference layer 332 of MTJ 330 is fabricated over ferromagnetic coupling layer 328. Tunneling barrier layer 334 of MTJ 330 is fabricated over reference layer 332. Free layer 336 of MTJ 330 is fabricated over tunneling barrier layer 334. Note that synthetic antiferromagnetic layer 326 technically also includes ferromagnetic coupling layer 328 and reference layer 332, but are shown separately here for explanation purposes.

As shown in FIG. 5, the magnetization vector of reference layer 332 has a magnetization direction that is perpendicular to its plane. As also seen in FIG. 5, free layer 336 also has a magnetization vector that is perpendicular to its plane, but its direction can vary by 180 degrees. In addition, free layer 336 design may include magnetization of the free layer 336 pointing a few degrees away from its perpendicular axis. The tilted angle of the free layer magnetization can be due to interaction with the PSC magnetic layer 350 or due to magnetocrystalline anisotropy, and will additionally help switching of the free layer magnetization by improving the initiation of the switching. Because reference layer 332 and free layer 336 each have a magnetic direction that is perpendicular to their respective planes, MTJ 330 is known as a perpendicular MTJ.

A nonmagnetic spacer layer 340 is disposed over of MTJ 330. Precessional spin current ("PSC") magnetic structure 350 is disposed over nonmagnetic spacer layer 340. In one embodiment, PSC magnetic structure 350 has a magnetization vector having a magnetic direction parallel to its plane, and is perpendicular to the magnetic vector of the reference layer 332 and free layer 336. One or more capping layers 370 can be provided on top of PSC layer 350 to protect the layers below on MTJ stack 300.

Nonmagnetic spacer layer 340 has a number of properties. For example, nonmagnetic spacer layer 340 physically separates the free layer 336 and the PSC structure 350. Nonmagnetic spacer layer 340 transmits spin current efficiently from the PSC magnetic structure 350 into the free layer 336. Nonmagnetic spacer layer 340 also promotes good microstructure and high tunneling magnetoresistance (TMR) and helps keep the damping constant of the free layer 336 low.

In accordance with the present teachings, PSC magnetic structure 350 comprises multiple layers. A first precessional spin current ("PSC") ferromagnetic layer 343 is formed over nonmagnetic spacer layer 340. A nonmagnetic precessional spin current ("PSC") insertion layer 345 is formed over first PSC ferromagnetic layer 343. A second precessional spin current ("PSC") ferromagnetic layer 347 is formed over nonmagnetic PSC insertion layer 345.

The nonmagnetic PSC insertion layer 345 improves performance of PSC magnetic structure 350 because it allows tailoring of both the static and dynamic coupling of the PSC magnetic structure 350 to free layer 336. The static coupling is exchange coupling while the dynamic coupling is the spin pumping effect.

Separating first and second ferromagnetic PSC layers 343 and 347 by nonmagnetic PSC insertion layer 345 avoids strong magneto-static coupling of the PSC magnetic structure 350 to free layer 336. This improves the impact that precession of PSC magnetic structure 350 has on free layer 336 while also retaining the stability of free layer 336. In an embodiment, a thin nonmagnetic PSC insertion layer 345 is used, which can achieve static and dynamic coupling of first and second ferromagnetic PSC layers 343 and 347 via nonmagnetic PSC insertion layer 345. Static coupling takes place via exchange coupling while dynamic coupling takes place via spin pumping. The static and dynamic coupling causes precession of the magnetic directions of the magnetic vectors of first and second ferromagnetic PSC layers 343 and 347. In an embodiment, nonmagnetic PSC insertion layer 345 can have a thickness ranging from one nanometer to three nanometers. When nonmagnetic PSC insertion layer 345 has a thickness of approximately one nanometer, one can achieve static coupling via exchange and dynamic coupling via spin pumping effect of precessing magnetizations of adjacent first and second ferromagnetic PSC layers 343 and 347. When the thickness of nonmagnetic PSC insertion layer 345 is greater than one nanometer, the exchange coupling between adjacent first and second ferromagnetic PSC layers 343 and 347 becomes smaller, but dynamic coupling via spin pumping effect will be present and becomes dominant. This approach provides better control of the coupling between PSC magnetic structure 350 and free layer 336.

The spin polarized current that can switch free layer 336 of magnetic tunnel junction 330 is provided by PSC magnetic structure 350 by using a spin pumping mechanism and/or exchange coupling which is facilitated via nonmagnetic PSC insertion layer 345. First ferromagnetic PSC layer 343, which can be directly deposited on nonmagnetic spacer layer 340, ensures continuity of a spin current generated by the second ferromagnetic PSC layer 347 and transfers the spin polarized electrons of the programming current to free layer 336. In addition, when a small DC current passes through PSC magnetic structure 350, e.g., during a device read operation, only a small transverse component of the precessing magnetic vector of PSC magnetic structure 350 is transferred to free layer 336. This small transverse component of precessing magnetic vector of PSC magnetic structure 350 is normal to the film plane of PSC magnetic structure 350 and parallel to free layer 336. According to spin pumping and spin diffusion theory, since the transverse component of precessing magnetic vector is related to magnetic damping, this contribution can also be tuned by selecting an appropriate material as well as material thickness to achieve different magnetic damping coefficient. This in principal can contribute to enhanced stabilization of free layer 336 and improve data retention.

As discussed, an MRAM cell is programmed by passing direct current from, for example, current source 375, through the PSC magnetic structure 350, magnetic tunnel junction 330, and the remaining structures of device 300. Current used for programming (e.g., a write operation) can be significantly higher than current used for read operations. For the higher DC currents used during a device write operation, the precessional angle of the magnetic vector of second PSC ferromagnetic layer 347 becomes large. In addition, the in-plane component of the magnetic vector of second PSC ferromagnetic layer 347 is transferred to the first PSC ferromagnetic layer 343 by spin pumping, which is now orthogonal to free layer 336, thus lowering the energy barrier required for switching of free layer 336. As a result, the amount of switching current required to switch free layer 336 is reduced when compared to other MRAM devices that use fixed polarizing layers, e.g., polarizer layer 150 or other PSC magnetic layers.

Figure 10:
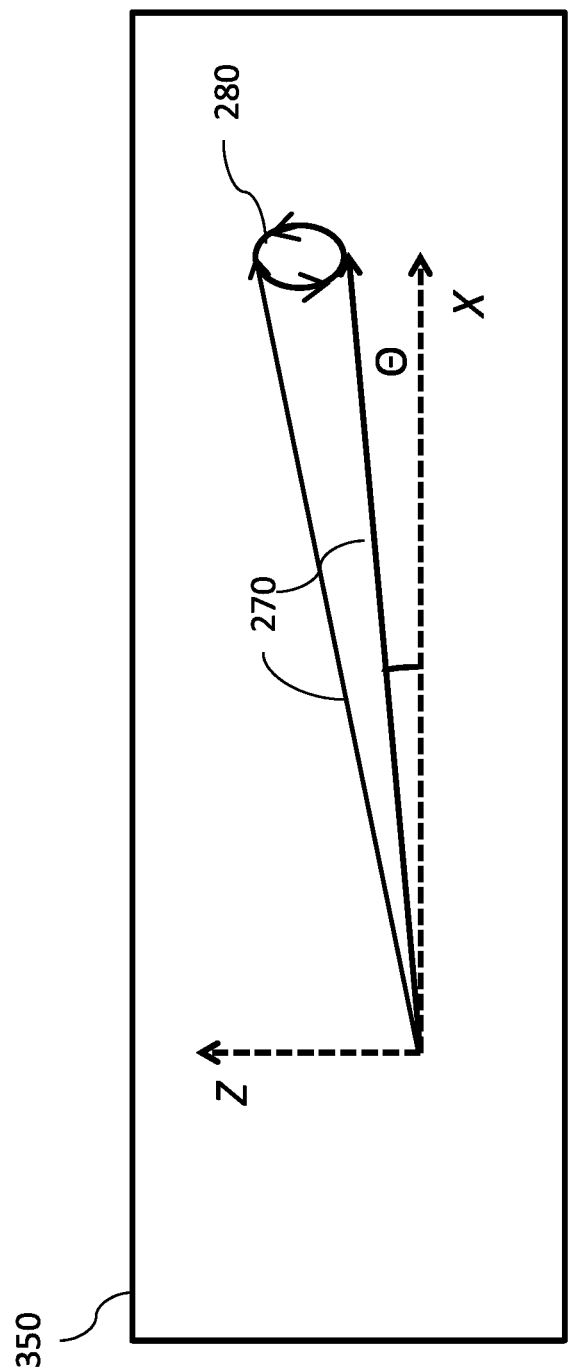
FIG. 10 illustrates the magnetic direction of the precessional spin current magnetic layer of an embodiment.

PSC magnetic structure 350 has the following additional properties. First, in one embodiment, the magnetization direction of PSC magnetic structure 350 is in the plane of the layer but is perpendicular to magnetization direction of free layer 336. In other embodiments such as shown in FIG. 10, the magnetization direction of PSC magnetic structure 350 can have a horizontal component X and perpendicular component Z such that the angle $\Theta$ between the plane of free layer 336 and the magnetic direction 270 of PSC magnetic structure 350 can be anywhere between 0 and less than 90 degrees, although, as discussed, the angle is as close to zero as feasible so that the magnetic direction remains in-plane. Likewise, as shown, the magnetization vector can also spin in a rotational manner, shown in FIG. 10 as cone-like rotation 280 while precessing about its perpendicular axis. Note that the angle $\Theta$ between the plane of free layer 336 and the magnetic direction 270 of PSC magnetic layer 350 will vary in this situation.

Seed layer 320 in the MTJ structure shown in FIG. 5 preferably comprises Ta, TaN, Cr, Cu, CuN, Ni, Fe or alloys thereof. First SAF layer 322 preferably comprises either a Co/Ni or Co/Pt multilayer structure. Second SAF layer 326 preferably comprises either a Co/Ni or Co/Pt multilayer structure plus a thin nonmagnetic layer comprised of tantalum having a thickness of two to five Angstroms. Antiferromagnetic coupling layer 324 is preferably made from Ru having thickness in the range of three to ten Angstroms. Ferromagnetic coupling layer 328 can be made of a layer of Ta, W, Mo or Hf having a thickness in the range of 1.0 to 10 Angstroms. Tunneling barrier layer 334 is preferably made of an insulating material such as MgO, with a thickness of approximately ten Angstroms. Free layer 336 is preferably made with CoFeB deposited on top of tunneling barrier layer 334. Free layer 336 can also have layers of Fe, Co, Ni or alloys thereof. Spacer layer 340 over MTJ 330 can be any nonmagnetic material such as 2 to 20 Angstroms of Ruthenium, 2-20 Angstroms of Ta, 2-20 Angstroms of TaN, 2-20 Angstroms of Cu, 2-20 Angstroms of CuN, or 2-20 Angstroms of MgO.

The manner in which a bit is written using the precessional spin current MTJ structure 300 will now be described.

In particular, an electrical current is supplied, for example, by a current source 375, which passes electrical current through the precessional spin current magnetic structure 350, the nonmagnetic spacer layer 340, the free magnetic layer 336, the nonmagnetic tunneling barrier layer 334, and the reference layer 332. The electrons of the electrical current passing through the precessional spin current magnetic structure 350 become spin polarized in the magnetic direction thereof, thus creating a spin polarized current that passes through nonmagnetic spacer layer 340. The spin polarized current exerts a spin transfer torque on free magnetic layer 336, which helps overcome the inherent damping of the magnetic material making up the free layer 336. This causes the free magnetic layer 336 to precess about its axis, which is shown in FIG. 4.

Once the magnetic direction of the free magnetic layer 336 begins to precess, the magnetic direction of the PSC magnetic structure 350 begins to rotate, as is also seen in FIG. 4. The rotation of the magnetic direction of the PSC magnetic structure 350 causes the spin polarization of the electrons of the electrical current to change in a manner corresponding to the magnetic direction of the PSC magnetic structure 350. Because the spin of the electrons of the spin polarized current corresponds to the magnetic direction of PSC magnetic structure 350, the spin of the electrons applies spin transfer torque to the free layer 336 in a direction that varies through an entire switching cycle. Thus, devices using PSC magnetic structure 350 can provide spin transfer torque 310 for an entire switching cycle.

In particular, the structure described herein utilizing PSC magnetic structure 350 and spacer layer 340 creates precessional magnetization that provides spin current to the free layer 336 of an MTJ throughout the whole precession cycle and therefore significantly enhances the free layer switching process, which will result in faster write times.

Figure 6A:
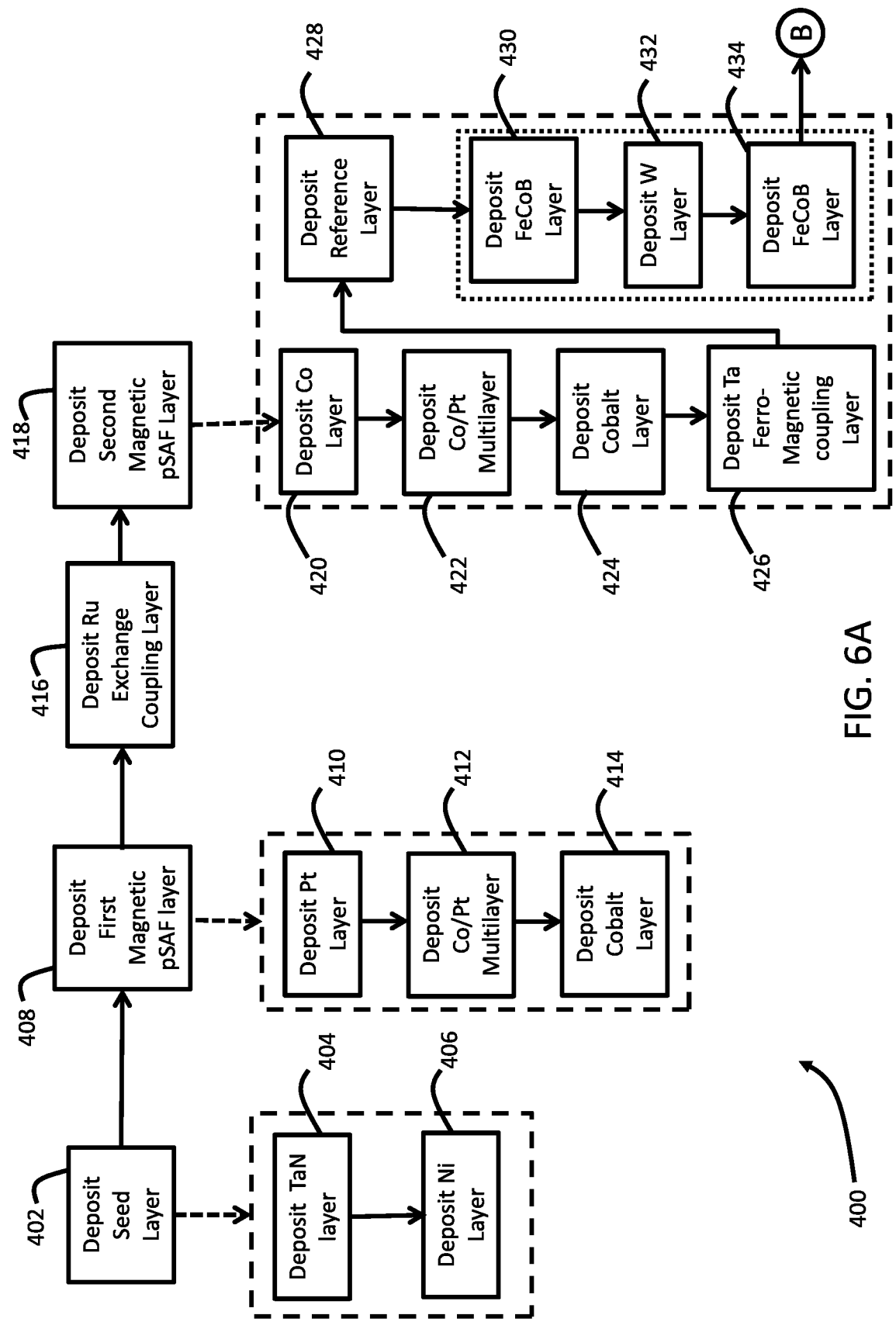
FIGS. 6A-6B is a flow chart showing manufacturing steps for an embodiment of an MRAM device having a precessional spin current magnetic layer as described herein.
Figure 6B:
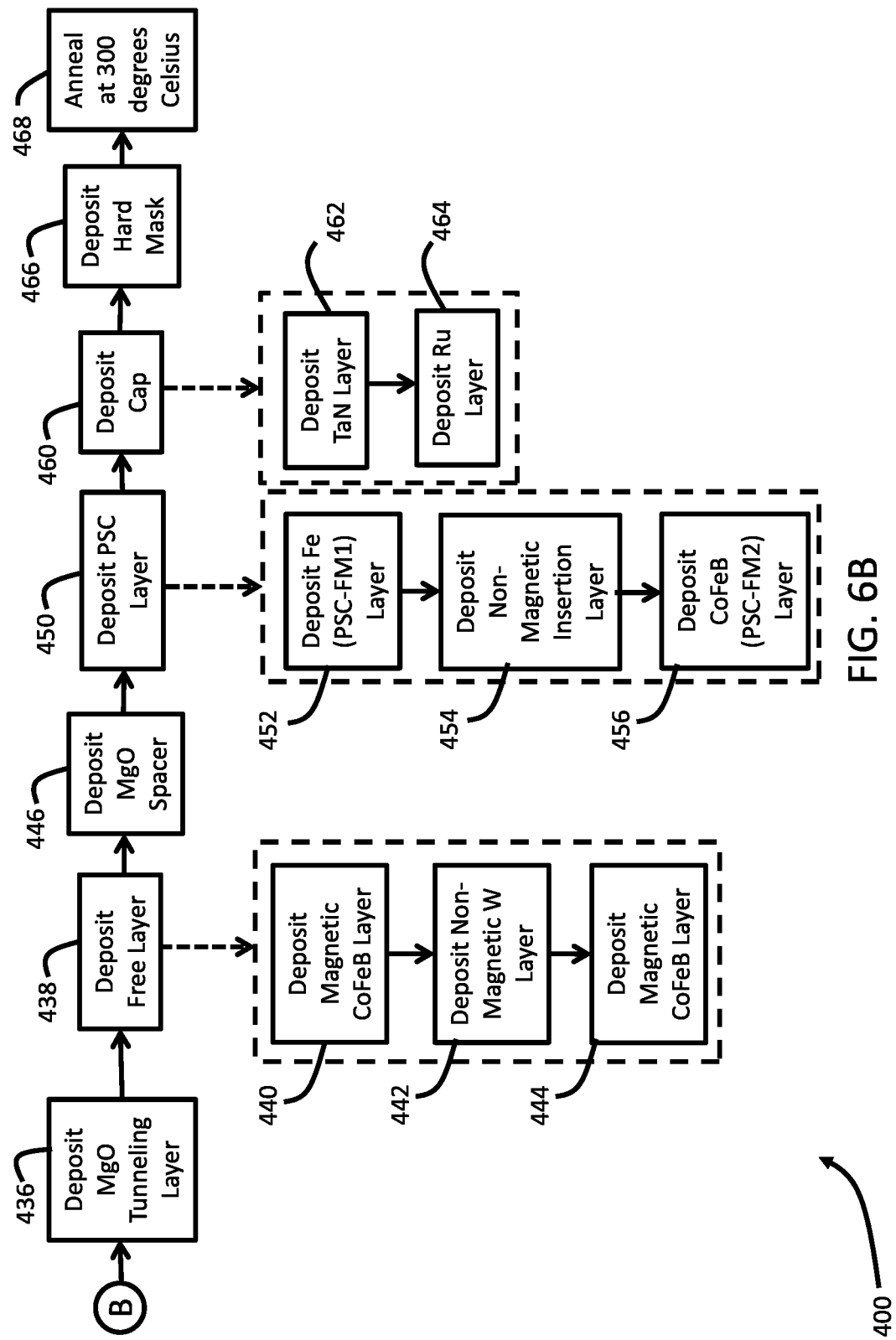
Figure 7:
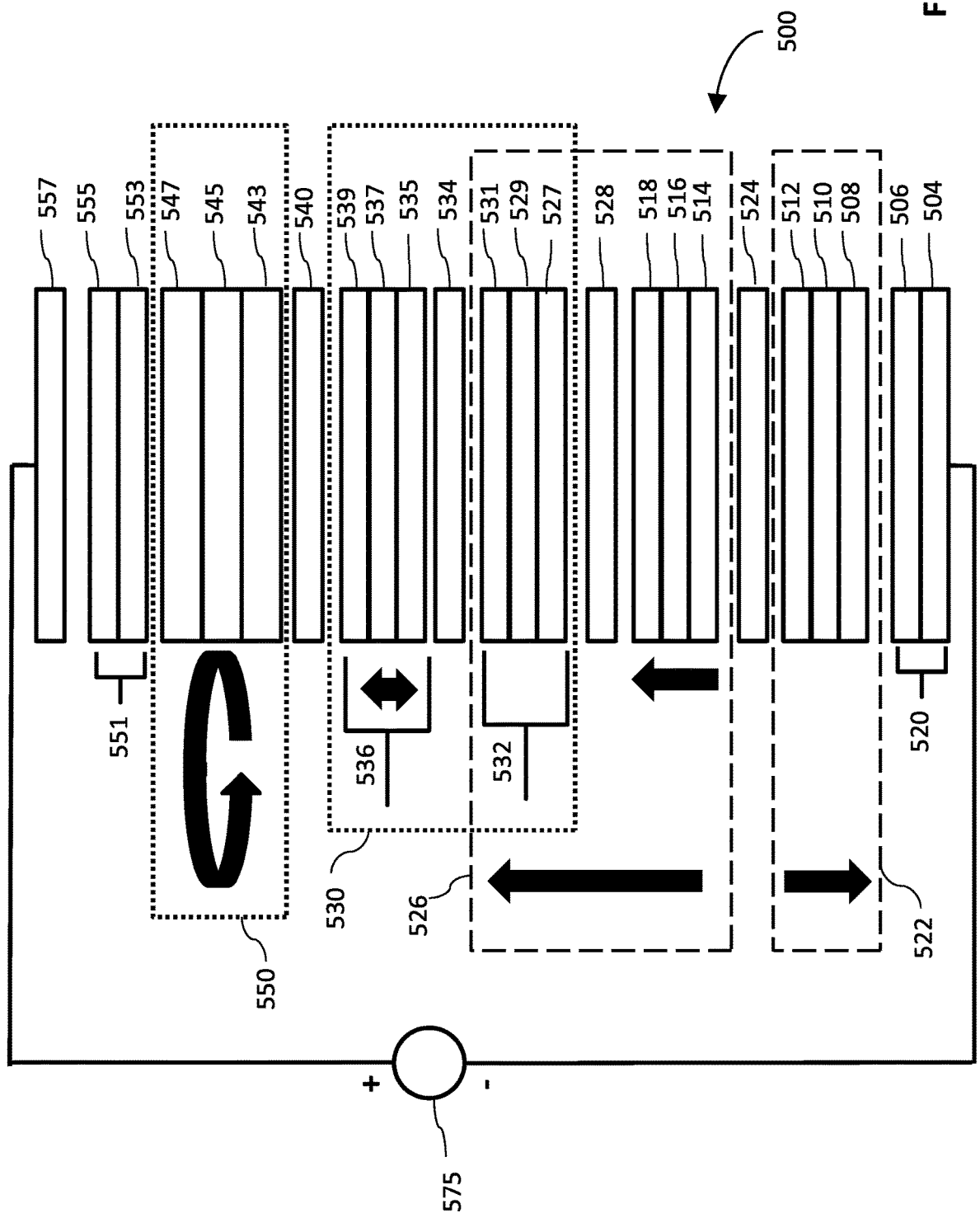
FIG. 7 illustrates an embodiment of an MTJ stack for an MRAM device having a precessional spin current magnetic layer with a nonmagnetic precessional spin current insertion layer.

A flowchart showing a method 400 of manufacturing an embodiment of an MRAM stack 500 is illustrated in FIGS. 6A-6B. MRAM stack 500 will normally be fabricated on some form of substrate, which in certain embodiments can be a silicon substrate. MRAM stack 500 is illustrated in FIG. 7. First step 402 is to deposit seed layer 520. In an embodiment, seed layer 520 can be constructed by depositing, at step 404, a TaN layer 504 and then, at step 406, depositing a Cu layer 506. In an embodiment, TaN layer 504 is a thin film having a thickness of five nanometers and Cu layer 506 is a thin film having a thickness of five nanometers. In alternative embodiments, TaN layer 504 can have a thickness ranging from 2 to 20 nanometers while Cu layer 506 can have a thickness ranging from 0 to 20 nanometers.

At step 408, first perpendicular synthetic antiferromagnetic layer 522 is deposited. In an embodiment, first perpendicular synthetic antiferromagnetic layer 522 can comprise a Pt layer 508 (deposited at step 410), a Co/Pt multilayer 510 (deposited at step 412) and a Co layer 512 (deposited at step 414). In an embodiment, Pt layer 508 is a Pt thin film having a thickness of 0.7 nanometers. In other embodiments, Pt layer 508 can comprise a Pt thin film having a thickness ranging from 0.5 to 20 nanometers. Co/Pt multilayer 510 can comprise a thin film of Co having a thickness of 0.6 nanometers and a thin film of Pt having a thickness of 0.4 nanometers. In other embodiments, the Co layer of Co/Pt multilayer 510 can have a thickness of 0.1 to 1.0 nanometers and the Pt layer of Co/Pt multilayer 510 can have a thickness ranging from 0.1 to 1.0 nanometers. In an embodiment, Co/Pt multilayer 510 is repeated such that Co/Pt multilayer 510 comprises six Co/Pt multilayers. In an embodiment, Co layer 512 is a thin film having a thickness of 0.6 nanometers. In other embodiments, Co layer 512 can have a thickness ranging from 0.1 to 1.0 nanometers.

As seen in FIG. 7, first perpendicular synthetic antiferromagnetic layer 522 has a magnetic vector having a direction perpendicular to its plane. The magnetic direction of first perpendicular synthetic antiferromagnetic layer 522 is fixed and will not change directions (i.e., rotate or precess) under normal operating conditions.

At step 416, exchange coupling layer 524 is deposited. In an embodiment, exchange coupling layer 524 comprises a Ru thin film having a thickness of 0.8 nanometers, and in other embodiments can range from 0.3 to 1.5 nanometers.

At step 418, second perpendicular synthetic antiferromagnetic layer 526 is fabricated. Fabrication of second perpendicular synthetic antiferromagnetic layer 526 (step 418) comprises many steps, and includes fabrication of reference layer 532 of magnetic tunnel junction 530, as will be discussed. At step 420, Co layer 514 is deposited. In an embodiment, Co layer 514 is a thin film having a thickness of 0.3 nanometers and in other embodiments, can have a thickness of 0.1 to 1.0 nanometers. Thereafter, at step 420, a Co/Pt multilayer 516 is deposited. In an embodiment, Co/Pt multilayer 516 comprises a thin film of Co having a thickness of 0.6 nanometers and a thin film of Pt having a thickness of 0.4 nanometers. In other embodiments, the thin film of Co can have a thickness of 0.1 to 1.0 nanometers while the thin film of Pt can have a thickness of 0.1 to 1.0 nanometers. Moreover, Co/Pt multilayer 516 can comprise multiple Co/Pt layers as described herein. In an embodiment, Co/Pt multilayer 516 has two Co/Pt multilayers with the thickness properties described above. After depositing Co/Pt multilayer 516 at step 422, the method described herein deposits a cobalt layer 518 at step 424. In an embodiment, Co layer 518 is a thin film having a thickness of 0.6 nanometers, while other embodiments, Co layer 518 can have a thickness in the range of 0.1 to 1.0 nanometers. Together, Co layer 514, Co/Pt layer 516 and Co layer 518 form a magnetic structure. The magnetic direction of the combination of Co layer 514, Co/Pt layer 516 and Co layer 518 is fixed, perpendicular to the plane of each layer, and antiparallel to the magnetic direction of first perpendicular synthetic antiferromagnetic layer 522.

The magnetic properties of the combination of Co layer 514, Co/Pt layer 516 and Co layer 518 will interact with the magnetic properties of reference layer 532 of second perpendicular synthetic antiferromagnetic layer 526 to generate a magnetic vector having a fixed magnetic direction that is also perpendicular to the plane of each layer of second perpendicular synthetic antiferromagnetic layer 526 and antiparallel to the magnetic direction of first perpendicular synthetic antiferromagnetic layer 522. These magnetic vectors are illustrated and FIG. 7, where it can be seen that the second perpendicular synthetic antiferromagnetic layer 526 has a fixed and perpendicular magnetic direction that is antiparallel to the magnetic direction of first perpendicular synthetic antiferromagnetic layer 522. Note that the magnetic directions of second perpendicular synthetic antiferromagnetic layer 526 and first perpendicular synthetic antiferromagnetic layer 522 are fixed under normal operating conditions.

After deposition of Co layer 518 (step 424), a ferromagnetic coupling layer 528 is deposited (step 526). In an embodiment, ferromagnetic coupling layer 528 is a thin film of Ta having a thickness of 0.2 nanometers. In other embodiments, ferromagnetic coupling layer 528 can be a thin film of Ta, W, Hf or Mo having a thickness ranging from 0.1 to 1.0 nanometers.

After deposition of ferromagnetic coupling layer 528 at step 426, reference layer 532 is deposited (step 428). Step 428, fabrication of reference layer 532, comprises several steps, including deposition of magnetic layer 527 (step 430), deposition of a tungsten (W) layer 529 (step 432) and deposition of magnetic layer 531 (step 434). In an embodiment, magnetic layer 527 comprises a thin film of CoFeB comprised of sixty percent iron (Fe), twenty percent cobalt (Co) and twenty percent boron (B), where the thin film has a thickness of 0.6 nanometers. In an embodiment, W layer 529 comprises a thin film having a thickness of 0.2 nanometers. In an embodiment, magnetic layer 531 comprises a thin film of CoFeB comprised of sixty percent iron (Fe), twenty percent cobalt (Co) and twenty percent boron (B), where the thin film has a thickness of 0.8 nanometers. In other embodiments, magnetic layer 527 can comprise a thin film of CoFeB having a thickness ranging from 0.5 to 1.5 nanometers, W layer 529 can comprise a thin film having a thickness of 0.1 to 1.0 nanometers, and magnetic layer 531 can comprise a thin film of CoFeB having a thickness of 0.5 to 2.0 nanometers.

Reference layer 532 is constructed using magnetic materials so that it has a magnetic vector having a magnetic direction perpendicular to its plane, is fixed in direction, and is antiparallel to the magnetic direction of first perpendicular synthetic antiferromagnetic layer 522. As discussed and as seen in FIG. 7, the collective materials of the second perpendicular synthetic antiferromagnetic layer 526 have a magnetic vector having a magnetic direction that is perpendicular to the plane of each of its collective layers, is fixed in direction and antiparallel to the magnetic direction of first perpendicular synthetic antiferromagnetic layer 522. Note that the particular magnetic direction of first perpendicular synthetic antiferromagnetic layer 522 and second perpendicular synthetic antiferromagnetic layer 526 is not important, so long as they are perpendicular to their respective planes and antiparallel to each other.

As discussed, reference layer 532 is one of the structures forming magnetic tunnel junction 530. The flowchart showing the method of manufacturing MRAM stack 500, including magnetic tunnel junction 530, continues in FIG. 6B. At step 436, nonmagnetic tunneling barrier layer 534 is deposited on reference layer 532. In an embodiment, nonmagnetic tunneling barrier 534 is formed as a thin film of an insulating material, e.g., MgO, and has a thickness of 1.1 nm. The purpose of nonmagnetic tunneling barrier 534 is discussed above.

Manufacture of magnetic tunnel junction 530 continues at step 438, when free layer 536 is deposited over nonmagnetic tunneling barrier 534. Fabrication of free layer 536 comprises several steps. At step 440, a magnetic layer 535 is deposited over nonmagnetic tunneling barrier 534. In an embodiment, magnetic layer 535 is comprised of a thin film of CoFeB comprised of sixty percent iron (Fe), twenty percent cobalt (Co) and twenty percent boron (B), and having a thickness of 1.2 nanometers. In other embodiments, magnetic layer 535 can comprise a thin film of CoFeB or other suitable magnetic material having a thickness ranging from 0.5 to 2.0 nanometers. Manufacture of free layer 535 continues at step 442, where a W layer 537 is deposited. In an embodiment, W layer 537 comprises a thin film of W having a thickness of 0.2 nanometers, and in other embodiments can have a thickness ranging from 0.1 to 1.0 nanometers. At step 444, manufacture of free layer 536 continues with forming magnetic layer 539. In an embodiment, magnetic layer 539 can comprise a thin film of CoFeB comprised of sixty percent iron (Fe), twenty percent cobalt (Co) and twenty percent boron (B), and having a thickness of 0.9 nanometers. In other embodiments, magnetic layer 539 can comprise a thin film of CoFeB or other suitable magnetic material having a thickness ranging from 0.5 to 1.5 nanometers.

Collectively, magnetic layers 535 and 539, along with nonmagnetic W layer 537, form free magnetic layer 536. Free magnetic layer 536 has a magnetic vector having a magnetic direction perpendicular to its plane. In addition, free magnetic layer 536 design may include magnetization of the free layer 536 pointing a few degrees away from its perpendicular axis. The tilted angle of the free layer magnetization can be due to interaction with the PSC magnetic layer 550 or due to magnetocrystalline anisotropy, will additionally help switching of the free layer magnetization by improving the initiation of the switching. As seen in FIG. 7, the magnetic direction of free magnetic layer 536 can switch one hundred eighty (180) degrees from one direction to another, antiparallel, direction.

After fabrication of magnetic tunnel junction 530 at step 438, step 446 is performed in which a nonmagnetic spacer layer 540 is deposited. In an embodiment, nonmagnetic spacer layer 540 can comprise a thin film of MgO having a thickness of 0.9 nanometers. In other embodiments, spacer layer 540 can comprise a thin film of MgO having a thickness ranging from 0.5 to 1.5 nanometers. In other embodiments, spacer layer 540 can be constructed as described in U.S. patent application Ser. No. 14/866,359, filed Sep. 25, 2015, and entitled "Spin Transfer Torque Structure For MRAM Devices Having A Spin Current Injection Capping Layer." U.S. patent application Ser. No. 14/866,359 is hereby incorporated by reference in its entirety.

After deposition of spacer layer 540, precessional spin current magnetic structure 550 is deposited (step 450). As seen in FIG. 6B, manufacture of precessional spin current magnetic structure 550 comprises several steps. At step 452, first precessional spin current ferromagnetic layer 543 is fabricated over spacer layer 540. In an embodiment, first precessional spin current ferromagnetic layer 543 comprises a thin film of Fe having a thickness of 0.4 nanometers. In other embodiments, first precessional spin current ferromagnetic layer 543 can comprise a thin film of Fe having a thickness ranging from 0.5 to 2.0 nanometers.

At step 454, nonmagnetic precessional spin current insertion layer 545 is deposited over magnetic Fe layer 543. In an embodiment, nonmagnetic precessional spin current insertion layer 545 can comprise a thin film of Ru having a thickness of 1.5 nanometers. As will be discussed, the thickness of nonmagnetic precessional spin current insertion layer 545 can be selected to control and tune the coupling of the first precessional spin current ferromagnetic layer 543 to the second precessional spin current ferromagnetic layer 547 (described below). Use of nonmagnetic precessional spin current insertion layer 545 provides several improvements and advantages. For example, nonmagnetic precessional spin current insertion layer 545 enables precessional spin current magnetic structure 550 to utilize a spin pumping mechanism to control the spin torque efficiency of precessional spin current magnetic structure 550. Nonmagnetic precessional spin current insertion layer 545 also enables decreasing of dipolar fringing fields from precessional spin current magnetic structure 550 acting on free layer 536 due to the thickness of separation between the first precessional spin current ferromagnetic layer 543 and free layer 536. Strong fringing fields are an unwanted effect and can prevent free layer 536 from switching under normal operating conditions because of the large dipolar magnetic field acting on free layer 536.

While the nonmagnetic precessional spin current insertion layer 545 of the embodiment shown in FIG. 7 can be constructed of Ru, other nonmagnetic materials having a relatively long spin diffusion length, e.g., greater than five nanometers, can also be used. Examples of such nonmagnetic materials include Cu (which has a spin diffusion length of approximately 400 nm), Ag (which has a spin diffusion length of approximately 150 nm), Au (which has a spin diffusion length of approximately 35 nm), Mg (which has a spin diffusion length of approximately 150 nm) and Al (which has a spin diffusion length of approximately 300 nm). Ru, described above, has a spin diffusion length of approximately ten (10) nm. Use of materials like these, which have a relatively long spin diffusion length, makes it possible to achieve desired spin torque efficiency of precessional spin current magnetic structure 550 via dynamic coupling due to the spin pumping effect.

At step 456, second precessional spin current ferromagnetic layer 547 is deposited. In an embodiment, second precessional spin current ferromagnetic layer 547 comprises a thin film of CoFeB comprised of forty percent iron (Fe), forty percent cobalt (Co) and twenty percent boron (B), and having a thickness of 1.7 nanometers. In other embodiments, second precessional spin current ferromagnetic layer 547 can comprise a thin film of CoFeB, Co, Fe, Ni and their alloys having a thickness ranging between 1.0 to 5.0 nanometers.

Note that spacer layer 540 is used for effective injection of spin polarized current into magnetic tunnel junction 530 from precessional spin current magnetic structure 550. Spin current is generated by precessing the magnetization direction of second precessional spin current ferromagnetic layer 547 and carried by spin diffusive transport through nonmagnetic precessional spin current insertion layer 545 into first precessional spin current ferromagnetic layer 543 using spin pumping effect. The second precessional spin current ferromagnetic layer 547 and first precessional spin current ferromagnetic layer 543 magnetizations become dynamically coupled via spin pumping mechanism. First precessional spin current ferromagnetic layer 543 serves as a spin current injection layer, which provides continuity of the spin current generated by second precessional spin current ferromagnetic layer 547.

Note also that when nonmagnetic precessional spin current insertion layer 545 has a thickness above approximately one nanometer, the exchange coupling between first precessional spin current ferromagnetic layer 543 and second precessional spin current ferromagnetic layer 547 is significantly reduced. However, when nonmagnetic precessional spin current insertion layer 545 has a thickness above approximately one nanometer, dynamic coupling between second precessional spin current ferromagnetic layer 547 and first precessional spin current ferromagnetic layer 543 via the spin pumping effect becomes dominant. Thus, using a precessional spin current magnetic structure 550 having a first precessional spin current ferromagnetic layer 543 and second precessional spin current ferromagnetic layer 547 separated by nonmagnetic precessional spin current insertion layer 545 provides better control and allows for tuning of the coupling between the precessional spin current magnetic structure 550 and free layer 536.

After manufacture of precessional spin current magnetic structure 550 at step 450, a capping layer 551 is deposited (step 460). Manufacture of capping layer 551 can comprise depositing TaN layer 553 (step 462) and depositing Ru layer 555 (step 464). In an embodiment, TaN layer 553 comprises a thin film of TaN having a thickness of 2.0 nanometers, while in other embodiments, TaN layer 553 can have a thickness ranging from 1.0 to 5.0 nanometers. In an embodiment, Ru layer 555 comprises a thin film of Ru having a thickness of ten (10) nanometers, while in other embodiments, Ru layer 555 can have a thickness ranging from 1.0 to 20 nanometers. In other embodiments, capping layer 551 comprises a layer of Ru (with no TaN) or a layer of MgO. The selection of a particular capping structure is influenced, among several reasons, by the particular annealing temperature to be used. This is due to the fact that these particular materials will have different characteristics depending on the annealing temperature.

At step 466, a hard mask 557 is deposited. Hard mask 557 can comprise TaN. Thereafter, MTJ stack 500 is annealed at 300 degrees Celsius for one hour. Such a device, after annealing, had a tunneling magnetoresistance (TMR) above 100% with resistance area product (RA) range of 5-10 $\Omega\mu m^2$.

Figure 8A:
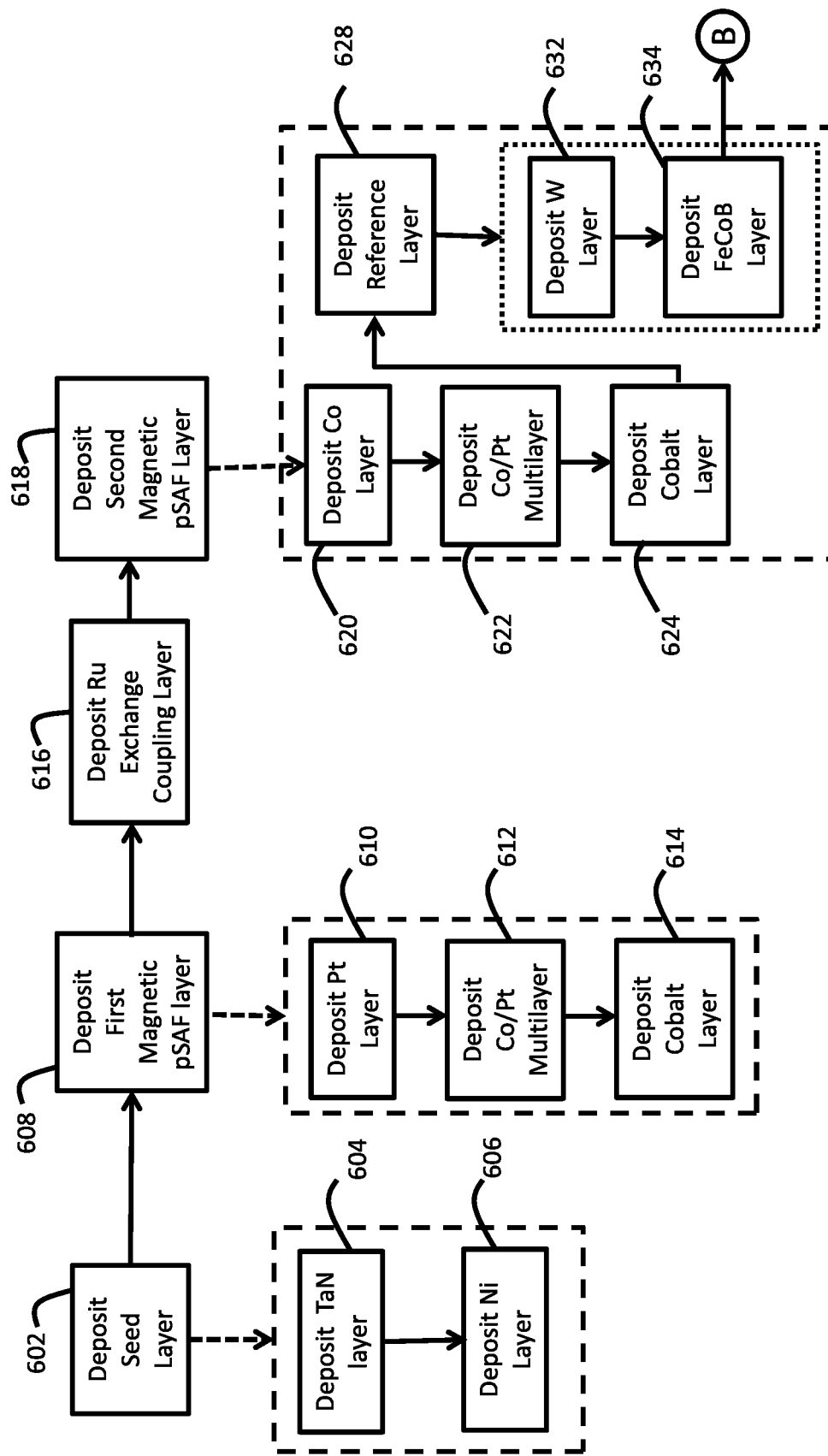
FIGS. 8A-8B is a flow chart showing manufacturing steps for an embodiment of an MRAM device having a precessional spin current magnetic layer as described herein.
Figure 8B:
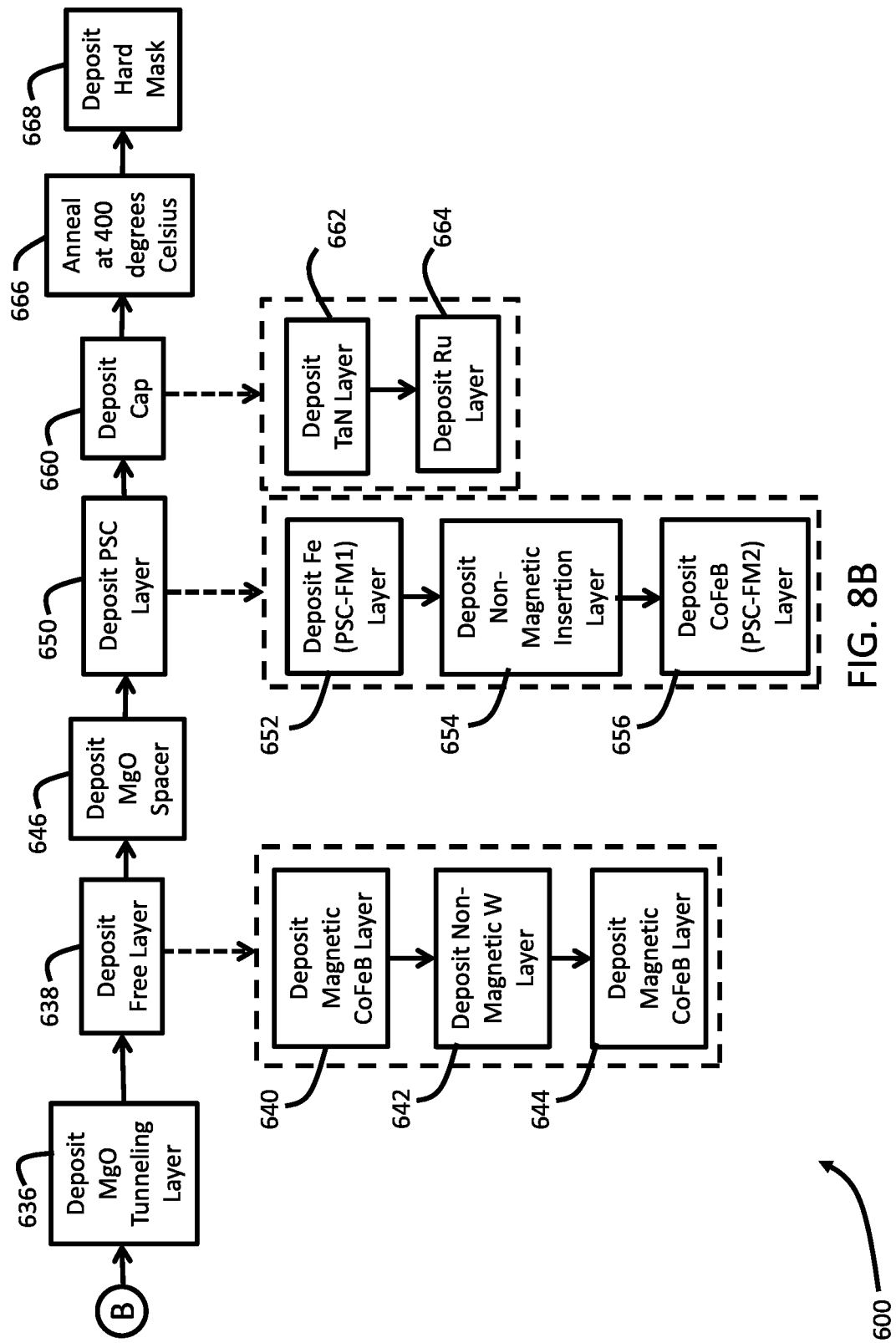
Figure 9:
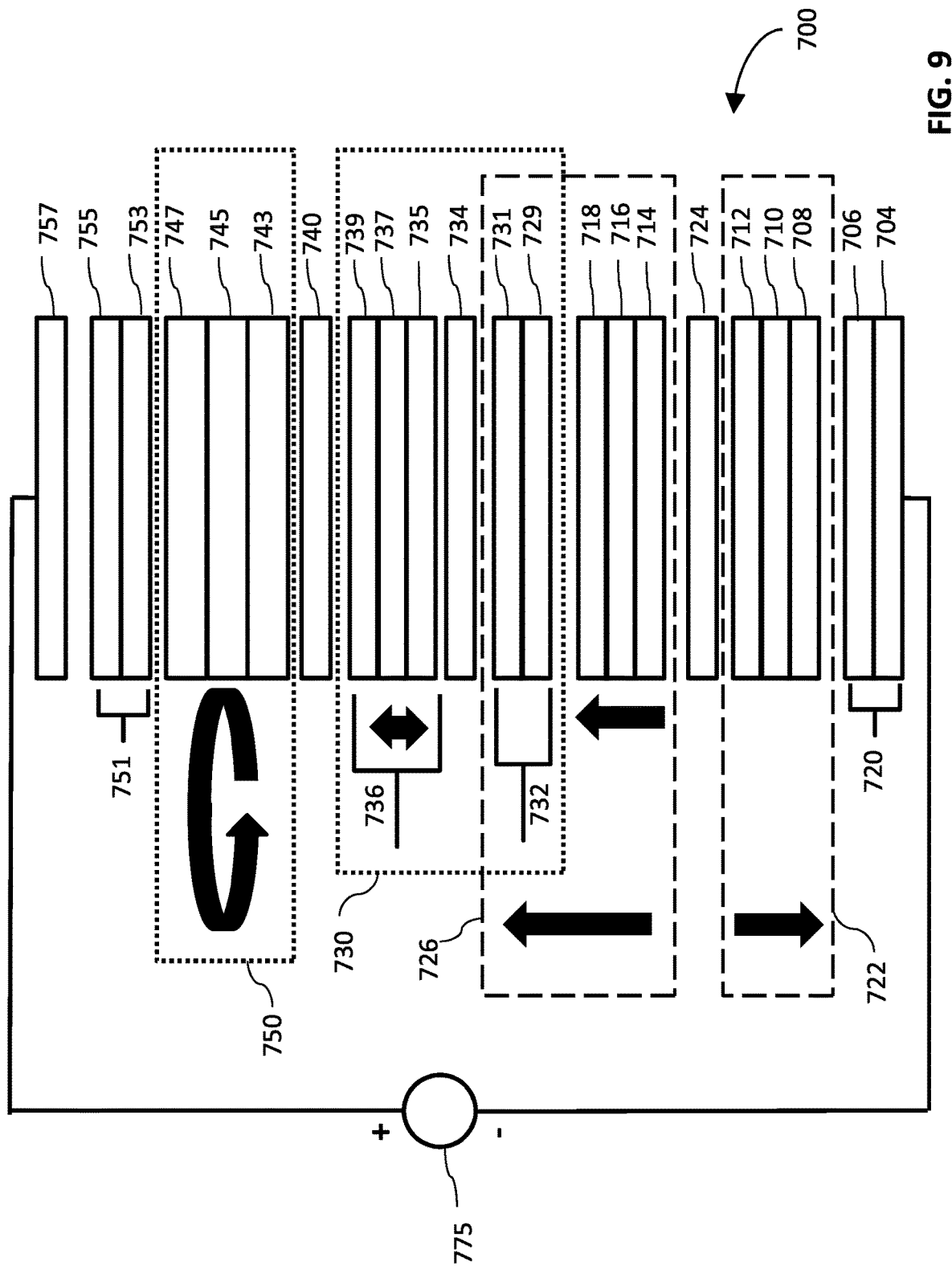
FIG. 9 illustrates another embodiment of an MTJ stack for an MRAM device having a precessional spin current magnetic layer with a nonmagnetic precessional spin current insertion layer.

A flowchart showing a method 600 of manufacturing an embodiment of an MRAM stack 700 is illustrated in FIGS. 8A-8B. MRAM stack 700 will normally be fabricated on some form of substrate, which in certain embodiments can be a silicon substrate, and can include complementary metal oxide semiconductor (CMOS) circuitry fabricated thereon. MRAM stack 700 is illustrated in FIG. 9. First step 602 is to deposit seed layer 720. In an embodiment, seed layer 720 can be constructed by depositing, at step 604, a TaN layer 704 and then, at step 606, depositing a Cu layer 706. In an embodiment, TaN layer 704 is a thin film having a thickness of ten nanometers and Cu layer 706 is a thin film having a thickness of three nanometers. In alternative embodiments, TaN layer 704 can have a thickness ranging from 2.0 to 20 nanometers while Cu layer 706 can have a thickness ranging from 0 to 20 nanometers.

At step 608, first perpendicular synthetic antiferromagnetic layer 722 is deposited. In an embodiment, first perpendicular synthetic antiferromagnetic layer 722 can comprise a Pt layer 708 (deposited at step 610), a Co/Pt multilayer 710 (deposited at step 612) and a Co layer 712 (deposited at step 614). In an embodiment, Pt layer 708 is a Pt thin film having a thickness of 0.7 nanometers. In other embodiments, Pt layer 708 can comprise a Pt thin film having a thickness ranging from 0.5 to 20 nanometers. Co/Pt multilayer 710 can comprise a thin film of Co having a thickness of 0.6 nanometers and a thin film of Pt having a thickness of 0.4 nanometers. In other embodiments, the Co layer of Co/Pt multilayer 710 can have a thickness of 0.1 to 1.0 nanometers and the Pt layer of Co/Pt multilayer 710 can have a thickness ranging from 0.1 to 1.0 nanometers. In an embodiment, Co/Pt multilayer 710 is repeated such that Co/Pt multilayer 710 comprises six Co/Pt multilayers. In an embodiment, Co layer 712 is a thin film having a thickness of 0.6 nanometers. In other embodiments, Co layer 712 can have a thickness ranging from 0.1 to 1.0 nanometers.

As seen in FIG. 9, first perpendicular synthetic antiferromagnetic layer 722 has a magnetic vector having a direction perpendicular to its plane. The magnetic direction of first perpendicular synthetic antiferromagnetic layer 722 is fixed and will not change directions (i.e., rotate or precess) under normal operating conditions. The thickness of synthetic antiferromagnetic layers can be chosen such as to minimize the dipolar fringing fields emerging from the reference layer and other magnetic layers within MTJ structure which act on a free layer after device fabrication At step 616, exchange coupling layer 724 is deposited. In an embodiment, exchange coupling layer 724 comprises an Ru thin film having a thickness of 0.8 nanometers, and in other embodiments can range from 0.3 to 1.5 nanometers.

At step 618, second perpendicular synthetic antiferromagnetic layer 726 is fabricated. Fabrication of second perpendicular synthetic antiferromagnetic layer 726 (step 618) comprises many steps, and includes fabrication of reference layer 732 of magnetic tunnel junction 730, as will be discussed. At step 620, Co layer 514 is deposited. In an embodiment, Co layer 714 is a thin film having a thickness of 0.3 nanometers and in other embodiments, can have a thickness of 0.1 to 1.0 nanometers. Thereafter, at step 620, a Co/Pt multilayer 716 is deposited. In an embodiment, Co/Pt multilayer 716 comprises a thin film of Co having a thickness of 0.6 nanometers and a thin film of Pt having a thickness of 0.4 nanometers. In other embodiments, the thin film of Co can have a thickness of 0.1 to 1.0 nanometers while the thin film of Pt can have a thickness of 0.1 to 1.0 nanometers. Moreover, Co/Pt multilayer 716 can comprise multiple Co/Pt layers as described herein. In an embodiment, Co/Pt multilayer 716 has two Co/Pt multilayers with the thickness properties described above. After depositing Co/Pt multilayer 716 at step 622, the method described herein deposits a cobalt layer 718 at step 624. In an embodiment, Co layer 718 is a thin film having a thickness of 0.9 nanometers, while in other embodiments, Co layer 718 can have a thickness in the range of 0.1 to 1.0 nanometers.

Together, Co layer 714, Co/Pt layer 716 and Co layer 718 form a magnetic structure. The magnetic direction of the combination of Co layer 714, Co/Pt layer 716 and Co layer 718 is fixed, perpendicular to the plane of each layer (although variations of several degrees are within the scope of what is considered perpendicular), and antiparallel to the magnetic direction of first perpendicular synthetic antiferromagnetic layer 722. The magnetic properties of the combination of Co layer 714, Co/Pt layer 716 and Co layer 718 will interact with the magnetic properties of reference layer 732 of second perpendicular synthetic antiferromagnetic layer 726 to generate a magnetic vector having a fixed magnetic direction that is also perpendicular to the plane of each layer of second perpendicular synthetic antiferromagnetic layer 726 and antiparallel to the magnetic direction of first perpendicular synthetic antiferromagnetic layer 722. These magnetic vectors are illustrated and FIG. 9, where it can be seen that the second perpendicular synthetic antiferromagnetic layer 726 has a fixed and perpendicular magnetic direction that is antiparallel to the magnetic direction of first perpendicular synthetic antiferromagnetic layer 722. Note that the magnetic directions of second perpendicular synthetic antiferromagnetic layer 726 and first perpendicular synthetic antiferromagnetic layer 722 are fixed under normal operating conditions.

After deposition of Co layer 718 at step 624, reference layer 732 is deposited (step 628). Step 628, fabrication of reference layer 732, comprises several steps, including deposition of a tungsten (W) layer 729 (step 632) and deposition of magnetic layer 731 (step 634). In an embodiment, W layer 729 comprises a thin film having a thickness of 0.3 nanometers. In an embodiment, magnetic layer 731 comprises a thin film of CoFeB comprised of sixty percent iron (Fe), twenty percent cobalt (Co) and twenty percent boron (B), where the thin film has a thickness of 0.8 nanometers. In other embodiments, W layer 729 can comprise a thin film having a thickness of 0.2 to 1.0 nanometers, and magnetic layer 731 can comprise a thin film of CoFeB having a thickness of 0.5 to 1.5 nanometers.

Reference layer 732 is constructed using magnetic materials so that it has a magnetic vector having a magnetic direction perpendicular to its plane, is fixed in direction, and is antiparallel to the magnetic direction of first perpendicular synthetic antiferromagnetic layer 722. As discussed and as seen in FIG. 9, the collective materials of the second perpendicular synthetic antiferromagnetic layer 726 have a magnetic vector having a magnetic direction that is perpendicular to the plane of each of its collective layers, is fixed in direction and antiparallel to the magnetic direction of first perpendicular synthetic antiferromagnetic layer 722. Note that the particular magnetic direction of first perpendicular synthetic antiferromagnetic layer 722 and second perpendicular synthetic antiferromagnetic layer 726 is not important, so long as they are perpendicular to their respective planes and antiparallel to each other.

As discussed, reference layer 732 is one of the structures forming magnetic tunnel junction 730. The flowchart showing the method of manufacturing MRAM stack 700, including magnetic tunnel junction 730, continues on FIG. 8B. At step 636, nonmagnetic tunneling barrier layer 734 is deposited on reference layer 732. In an embodiment, nonmagnetic tunneling barrier 734 is formed as a thin film of an insulating material, e.g., MgO, and has a thickness of 1.1 nm. The purpose of nonmagnetic tunneling barrier 734 is discussed above.

Manufacture of magnetic tunnel junction 730 continues at step 638, when free layer 736 is deposited over nonmagnetic tunneling barrier 734. Fabrication of free layer 736 comprises several steps. At step 640, a magnetic layer 735 is deposited over nonmagnetic tunneling barrier 734. In an embodiment, magnetic layer 735 is comprised of a thin film of CoFeB comprised of fifty-four (54) percent iron (Fe), eighteen (18) percent cobalt (Co) and twenty-eight (28) percent boron (B), with the thin film having a thickness of 1.5 nanometers. In other embodiments, magnetic layer 735 can comprise a thin film of CoFeB or other suitable magnetic material having a thickness ranging from 0.5 to 2.5 nanometers. Manufacture of free layer 735 continues at step 642, where a W layer 737 is deposited. In an embodiment, W layer 737 comprises a thin film of W having a thickness of 0.5 nanometers, and in other embodiments can have a thickness ranging from 0.2 to 1.0 nanometers. At step 644, manufacture of free layer 736 continues with forming magnetic layer 739. In an embodiment, magnetic layer 739 can comprise a thin film of CoFeB comprised of fifty-four (54) percent iron (Fe), eighteen (18) percent cobalt (Co) and twenty-eight (28) percent boron (B), with the thin film having a thickness of 0.8 nanometers. In other embodiments, magnetic layer 739 can comprise a thin film of CoFeB or other suitable magnetic material having a thickness ranging from 0.5 to 2.0 nanometers.

Collectively, magnetic layers 735 and 739, along with nonmagnetic W layer 737, form free magnetic layer 736. Free magnetic layer 736 has a magnetic vector having a magnetic direction perpendicular to its plane. In addition, free magnetic layer 736 design may include magnetization of the free layer 736 pointing a few degrees away from its perpendicular axis. The tilted angle of the free layer magnetization can be due to interaction with the PSC magnetic layer 750 or due to magnetocrystalline anisotropy, will additionally help switching of the free layer magnetization by improving the initiation of the switching. As seen in FIG. 9, the magnetic direction of free magnetic layer 736 can switch one hundred eighty (180) degrees from one direction to another, antiparallel, direction.

After fabrication of magnetic tunnel junction 733 at step 638, step 646 is performed in which a nonmagnetic spacer layer 740 is deposited. In an embodiment, nonmagnetic spacer layer 740 can comprise a thin film of MgO having a thickness of 0.9 nanometers. In other embodiments, spacer layer 740 can comprise a thin film of MgO having a thickness ranging from 0.5 to 2.0 nanometers. In other embodiments, spacer layer 740 can be constructed as described in U.S. patent application Ser. No. 14/866,359, filed Sep. 25, 2015, and entitled "Spin Transfer Torque Structure For MRAM Devices Having A Spin Current Injection Capping Layer." U.S. patent application Ser. No. 14/866,359 is hereby incorporated by reference in its entirety.

After deposition of spacer layer 740, precessional spin current magnetic structure 750 is deposited (step 650). As seen in FIG. 8B, manufacture of precessional spin current magnetic structure 750 comprises several steps. At step 652, first precessional spin current ferromagnetic layer 743 is fabricated over spacer layer 740. In an embodiment, first precessional spin current ferromagnetic layer 743 comprises a thin film of Fe having a thickness of 0.6 nanometers. In other embodiments, first precessional spin current ferromagnetic layer 743 can comprise a thin film of Fe having a thickness ranging from 0.5 to 2.0 nanometers.

At step 654, nonmagnetic precessional spin current insertion layer 745 is deposited over magnetic first precessional spin current ferromagnetic layer 743. In an embodiment, nonmagnetic precessional spin current insertion layer 745 can comprise a thin film of Ru having a thickness of 1.5 nanometers. As discussed in the context of the embodiment shown in FIG. 7, nonmagnetic precessional spin current insertion layer 745 provides several improvements and advantages. As discussed, nonmagnetic precessional spin current insertion layer 745 enables precessional spin current magnetic structure 750 to utilize a spin pumping mechanism to control the spin torque efficiency of precessional spin current magnetic structure 750. As also discussed, nonmagnetic precessional spin current insertion layer 745 also enables the spin pumping mechanism to couple precession of second precessional spin current ferromagnetic layer 747 (discussed below) to first precessional spin current ferromagnetic layer 743, thus allowing for the spin torque to be injected from the precessional spin current magnetic structure 750 into free layer 736 using nonmagnetic spacer layer 740.

While the nonmagnetic precessional spin current insertion layer 745 of the embodiment shown in FIG. 9 is constructed of Ru, other nonmagnetic materials having a relatively long spin diffusion length, e.g., greater than five nanometers, can also be used. Examples of such nonmagnetic materials include Cu (which has a spin diffusion length of approximately 400 nm), Ag (which has a spin diffusion length of approximately 150 nm), Au (which has a spin diffusion length of approximately 35 nm), Mg (which has a spin diffusion length of approximately 150 nm) and Al (which has a spin diffusion length of approximately 300 nm). Ru, described above, has a spin diffusion length of approximately ten (10) nm. Use of materials like these, which have a relatively long spin diffusion length, makes it possible to achieve the desired spin torque efficiency of precessional spin current magnetic structure 750 via dynamic coupling due to the spin pumping effect.

At step 656, second precessional spin current ferromagnetic layer 747 is deposited. In an embodiment, second precessional spin current ferromagnetic layer 747 comprises a thin film of CoFeB comprised of forty percent iron (Fe), forty percent cobalt (Co) and twenty percent boron (B), and having a thickness of 1.85 nanometers. In other embodiments, second precessional spin current ferromagnetic layer 747 can comprise a thin film of CoFeB, Co, Fe, Ni and their alloys having a thickness ranging between 1.0 to 5.0 nanometers.

Just as in device 500 shown in FIG. 7, spacer layer 740 is used for effective injection of spin polarized current into magnetic tunnel junction 730 from precessional spin current magnetic structure 750. As discussed, spin current is generated by precessing the magnetization direction of second precessional spin current ferromagnetic layer 747 and carried by spin diffusive transport through nonmagnetic precessional spin current insertion layer 745 into first precessional spin current ferromagnetic layer 743 using spin pumping effect. The second precessional spin current ferromagnetic layer 747 and first precessional spin current ferromagnetic layer 743 magnetizations become dynamically coupled via a spin pumping mechanism. First precessional spin current ferromagnetic layer 743 serves as a spin current injection layer, which provides continuity of the spin current generated by second precessional spin current ferromagnetic layer 747. As also discussed above regarding the device embodiment 500 of FIG. 7, the thickness of the nonmagnetic precessional spin current insertion layer 745 can be selected to select the desired amount of coupling of the second precessional spin current ferromagnetic layer 747 to the first precessional spin current ferromagnetic layer 743, which in turn can be used to tune the coupling of precessional spin current magnetic structure 750 to free layer 736.

After manufacture of precessional spin current magnetic structure 750 at step 650, a capping layer 751 is deposited (step 660). Manufacture of capping layer 751 can comprise depositing TaN layer 753 (step 662) and depositing Ru layer 755 (step 664). In an embodiment, TaN layer 753 comprises a thin film of TaN having a thickness of 2.0 nanometers, while in other embodiments, TaN layer 753 can have a thickness ranging from 1.0 to 5.0 nanometers. In an embodiment, Ru layer 755 comprises a thin film of Ru having a thickness of ten (10) nanometers, while in other embodiments, Ru layer 755 can have a thickness ranging from 1.0 to 20 nanometers. In other embodiments, capping layer 751 comprises a layer of Ru (with no TaN) or a layer of MgO. As discussed, the selection of a particular capping structure is influenced, among several reasons, by the particular annealing temperature to be used. This is due to the fact that these particular materials will have different characteristics depending on the annealing temperature.

At step 666, MTJ stack 700 is annealed at 400 degrees Celsius for up to forty-five (45) minute soak time using in-situ rapid thermal annealing oven. At step 668, hard mask 757 is deposited. Hard mask 757 can comprise a layer of TaN having a thickness of 7.0 nanometers. The acceptable range of temperatures for the annealing step is within the range of 250 degrees Celsius to 450 degrees Celsius.

The MTJ stack 700 manufactured as described with the high temperature annealing step 666 results in a device 700 having tunneling magnetoresistance (TMR) of above one hundred sixty (160) percent (which is advantageously high) and a resistance area product (RA) range up to approximately ten (10) to twelve (12) $\Omega\mu m^2$. These TMR and RA characteristics of device 700 are highly desirable and indicate that precessional spin current magnetic structure 750 as described herein can withstand high temperature annealing at 400 degrees Celsius and still perform well. This means that a MTJ device 700 with precessional spin current magnetic structure 750 can be fabricated using a standard CMOS process. This is very advantageous since it means that custom manufacturing facilities are not required, and also means that MRAM memory can be embedded in CMOS integrated circuits.

Figure 11:
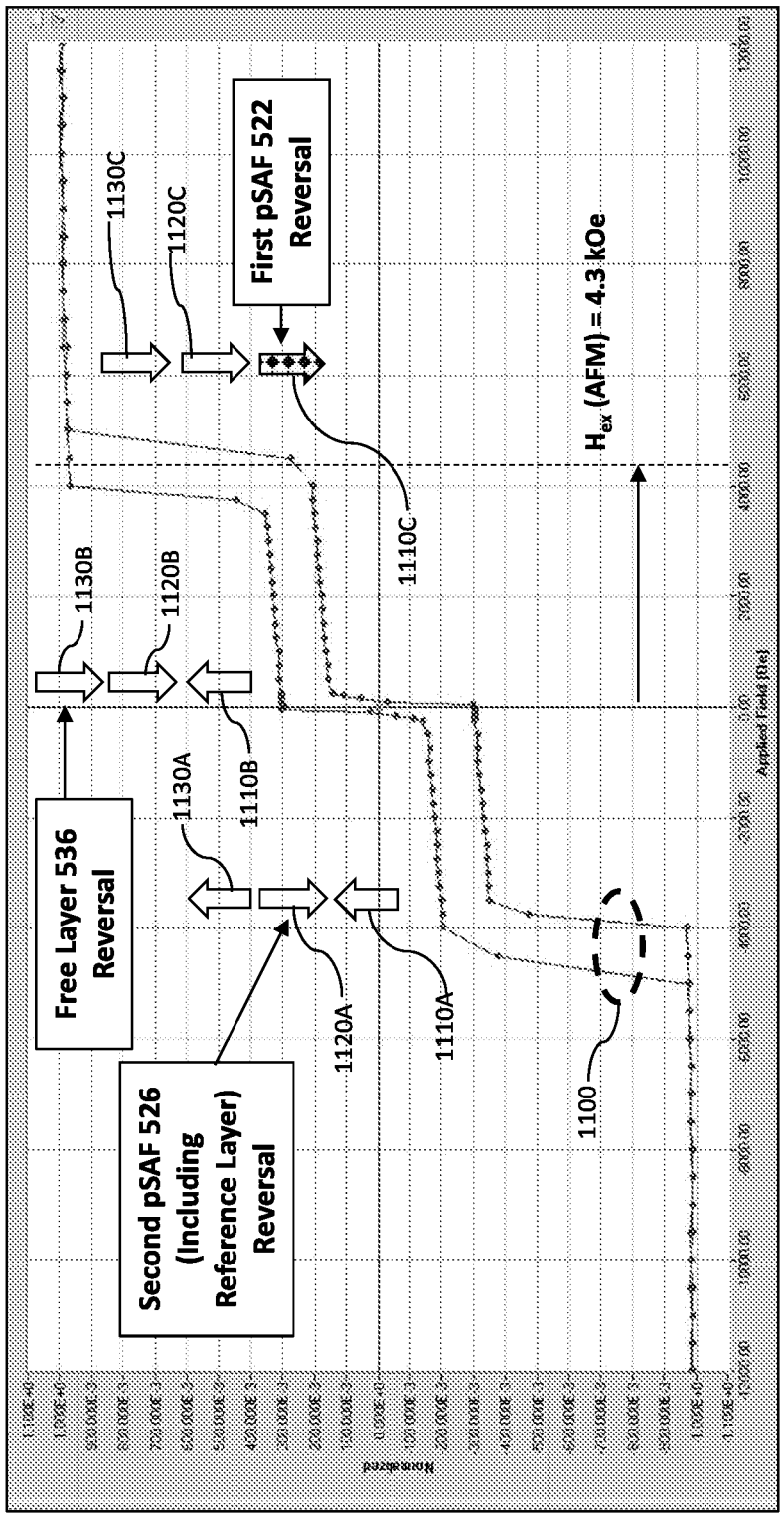
FIG. 11 is a graph of the thin film vibrating sample magnetometer (VSM) major hysteresis loop data for the device illustrated in FIG. 7 where the magnetic field is applied perpendicular to the plane of the device layers.

FIG. 11 is a graph of the thin film vibrating sample magnetometer (VSM) major hysteresis loop data for magnetic device 500 having magnetic tunnel junction 530 and precessional spin current magnetic structure 550. To obtain this VSM major hysteresis loop (labeled as 1100 in FIG. 11), a magnetic field was applied with a magnetic direction that was perpendicular to the sample plane i.e. along easy axis of magnetic tunnel junction 530. As seen in FIG. 11, the applied magnetic field started at −12,000 Oersteds, which then decreased to 0.00 Oersteds, before rising to +12,000 Oersteds, another very large magnetic field. The magnetic field was then decreased from +12,000 Oersteds to 0.00 Oersteds, and then increased to −12,000 Oersteds. Positive and negative signs of the DC applied field indicate perpendicular applied field directions of the field sweep.

Switching of the magnetic direction of particular components of the pMTJ is shown schematically by the arrows. Any switching of the magnetic direction of first perpendicular synthetic antiferromagnetic layer 522 is shown with the arrows 1110A, 1110B and 1110C, each of which illustrates the magnetic direction of the layer. Any switching of the magnetic direction of second perpendicular synthetic antiferromagnetic layer 526 is shown with the arrows 1120A, 1120B and 1120C, each of which illustrates the magnetic direction of the layer. Finally, any switching of free layer 536 is shown with the arrows 1130A, 1130B and 1130C, each of which illustrates the magnetic direction of the layer.

As is seen in FIG. 11, as the perpendicular magnetic field is decreased from −12,000 Oersteds, the magnetic direction first perpendicular synthetic antiferromagnetic layer 522, does not reverse directions until the magnetic field measures approximately +4,000 Oersteds. This is shown by arrow 1110C, illustrating that the magnetic direction of first perpendicular synthetic antiferromagnetic layer 522 has switched. This demonstrates first perpendicular synthetic antiferromagnetic layer 522 is very stable since it would not experience such conditions under normal use. This stability demonstrates that use of precessional spin current magnetic structure 550 does not negatively impact the stability of the entire reference layer 532 and its exchange coupling field.

As also seen in FIG. 11, second perpendicular synthetic antiferromagnetic layer 526 does not reverse directions until a perpendicular magnetic field of approximately −4,000 Oersteds is applied. This is shown by arrow 1120A, illustrating that the magnetic direction of second perpendicular synthetic antiferromagnetic layer 526 has switched. Because a device 500 will not experience such a large magnetic field under normal operating conditions, this test demonstrates that the second perpendicular synthetic antiferromagnetic layer 526 is very stable, which also demonstrates that use of precessional spin current magnetic structure 550 does not negatively impact other magnetic structures in device 500. This is also important since the reference layer 532 contained in second perpendicular synthetic antiferromagnetic layer 526 must have a fixed magnetic direction for the magnetic tunnel junction 530 to function properly.

Finally, FIG. 11 demonstrates that device 500, including precessional spin current magnetic structure 550, has excellent free layer switching performance. Switching of free layer occurs at approximately 0.00 Oersteds, and is illustrated by arrow 1130B.

Sharp switching transitions indicate good perpendicular anisotropies of first perpendicular synthetic antiferromagnetic layer 522, reference layer 532 (including second perpendicular synthetic antiferromagnetic layer 526) and free layer 536 of the perpendicular magnetic tunnel junction 530. Exchange coupling of 4.3 kOe indicates good stability of the reference layer. A slope of the hysteresis loop between ±3.0 kOe indicates a rotation of precessional spin current magnetic structure 550 which is orthogonal to the layers of perpendicular magnetic tunnel junction 530, i.e., along hard axis of the perpendicular applied field.

Figure 12:
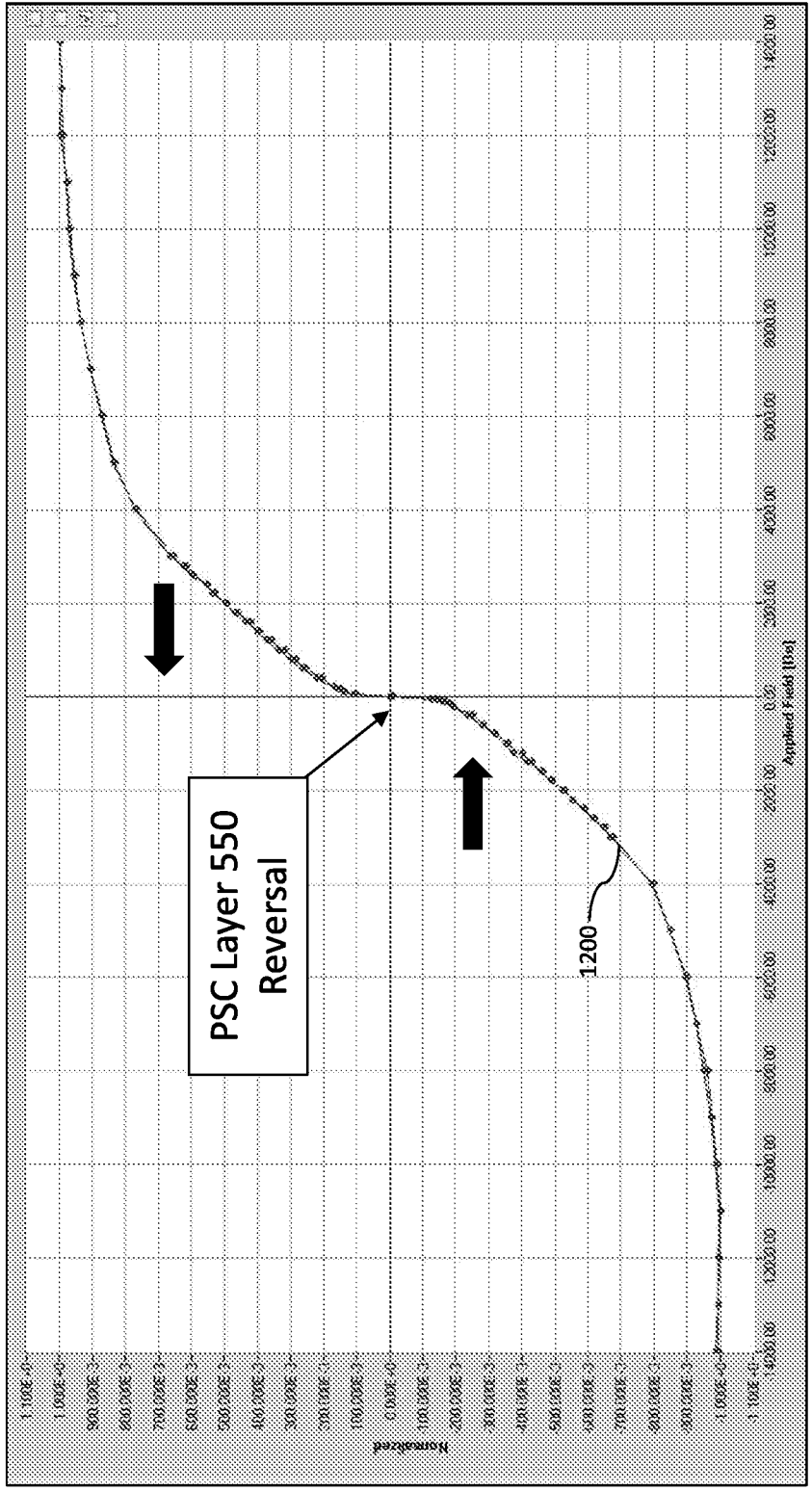
FIG. 12 is a graph of the thin film vibrating sample magnetometer (VSM) major hysteresis loop data for the device illustrated in FIG. 7 where the magnetic field is applied in the plane of the device layers.

FIG. 12 is a graph of the thin film vibrating sample magnetometer (VSM) major hysteresis loop data for magnetic device 500 having magnetic tunnel junction 530 and precessional spin current magnetic structure 550. To measure the VSM major hysteresis loop (labeled as 1200 in FIG. 12), a magnetic field was applied with a magnetic direction that was in the plane of the layers of magnetic tunnel junction 530. As seen in FIG. 12, the applied magnetic field started at −14,000 Oersteds, which then decreased to 0.00 Oersteds, before rising to +14,000 Oersteds, another very large magnetic field. The applied field was then decreased steadily from +12,000 Oersteds to 0.00 Oersteds, before increasing to −12000 Oersteds. The magnetic field was then decreased from +14,000 Oersteds to 0.00 Oersteds, and then increased to −14,000 Oersteds. Positive and negative signs of the DC applied field indicate in-plane applied field directions of the field sweep.

Increasing slope of the VSM major hysteresis loop 1200 corresponds to the slow rotation of the layers of magnetic tunnel junction 530 when the magnetic field is applied in-plane, which is orthogonal to the magnetic direction of those layers. The sharp transition of the VSM major hysteresis loop 1200 around zero field corresponds to precession of the precessional spin current magnetic structure 550. This sharp switching indicates that precessional spin current magnetic structure 550 is in-plane magnetized, i.e., along the easy axis of the in-plane applied magnetic field. In addition to the description above, the VSM major hysteresis loops 1100 and 1200 shown in FIGS. 11 and 12 demonstrate that free layer 530 and precessional spin current magnetic structure 550 are orthogonally magnetized with respect to each other.

Figure 13:
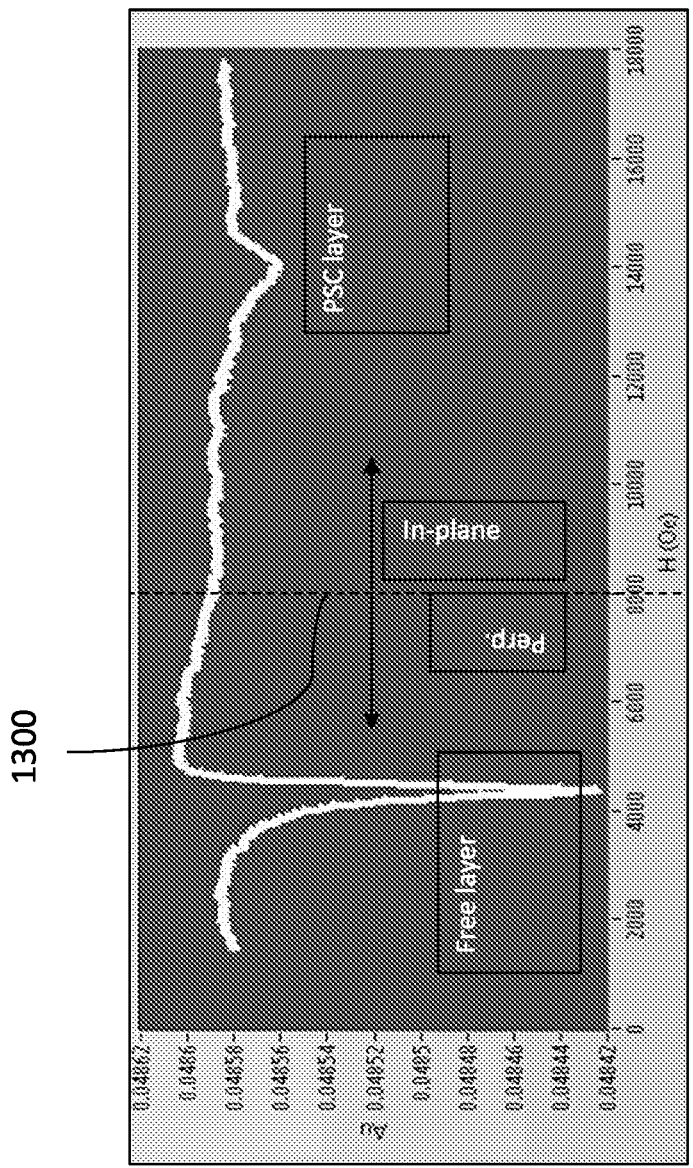
FIG. 13 is a graph illustrating ferromagnetic resonance (FMR) of an MRAM device illustrated in FIG. 7 having a precessional spin current magnetic layer.

FIG. 13 shows the ferromagnetic resonance of a magnetic tunnel junction device 500 having precessional spin current magnetic structure 550 measured at twenty-four (24) GHz. The magnetic field was applied in perpendicular direction. Dashed line 1300 at 8000 Oersteds indicates the region boundary $\omega/\gamma$ ~8.0 kGauss at 24 GHz between in-plane precessional spin current magnetic structure 550 and perpendicular magnetized free magnetic layer 536. Because free layer 536 has a magnetic direction perpendicular to its plane, the resonance line occurs in the resonance field below the $\omega/\gamma$ ~8.0 kGauss boundary according to the resonance equation: $\omega/\gamma = H_{res} - 4\pi M_{eff}$. Similarly precessional spin current magnetic structure 550 resonance will occur in the field above the $\omega/\gamma$ ~8.0 kGauss boundary indicating strong in-plane magnetization. The effective magnetization values indicate strong perpendicular anisotropy of the free layer 536 ($4\pi M_{eff}$~3.5 kGauss) and strong in-plane anisotropy of precessional spin current magnetic structure 550 ($4\pi M_{eff}$~6 kGauss).

Figure 14:
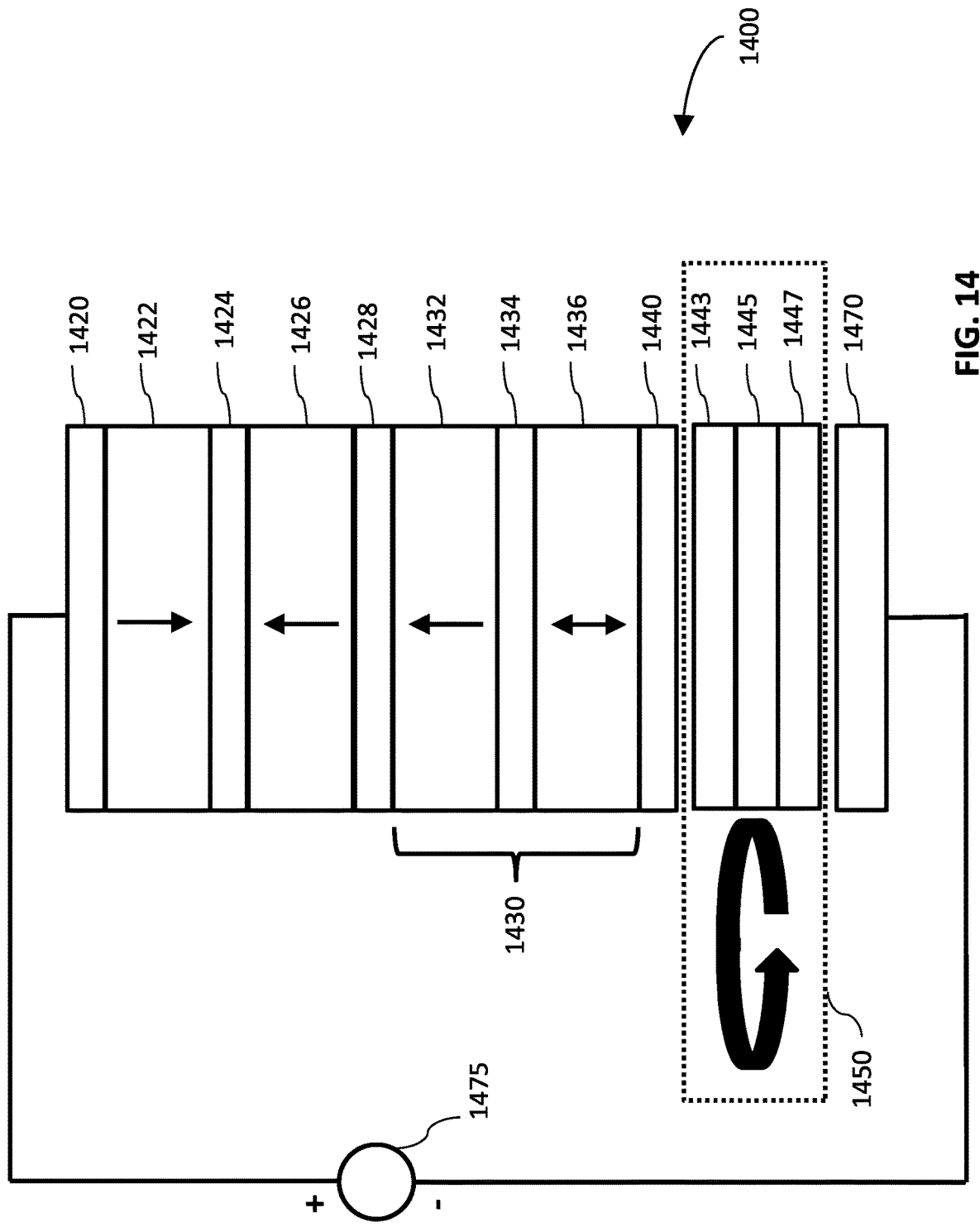
FIG. 14 is an alternative embodiment of an MTJ stack for an MRAM device having a precessional spin current magnetic layer with a nonmagnetic precessional spin current insertion layer.

An alternative embodiment is shown in FIG. 14. In this embodiment, magnetic device 1400 has its MTJ stack inverted with respect to the embodiment shown in FIG. 5. In particular, magnetic device 1400 includes a seed layer 1470. Precessional spin current magnetic structure 1450 is placed over seed layer 1470. PSC structure 1450 comprises a first precessional spin current ferromagnetic layer 1447, a nonmagnetic PSC insertion layer 1445 and a second precessional spin current ferromagnetic layer 1443. First precessional spin current ferromagnetic layer 1447 is similar to the second precessional spin current ferromagnetic layers 347, 547 and 747 described in the context of FIGS. 5, 7 and 9, respectively. Nonmagnetic PSC insertion layer 1445 is similar to the nonmagnetic PSC insertion layers 345, 545 and 747 described in the context of FIGS. 5, 7 and 9. Finally, second precessional spin current ferromagnetic layer 1443 is similar to first precessional spin current ferromagnetic layer 343, 543 and 743 described in the context of FIGS. 5, 7 and 9, respectively. Precessional spin current magnetic structure 1450 operates as described in the context of corresponding precessional spin current magnetic layers 350, 550 and 750.

Nonmagnetic spacer layer 1440 is placed over PSC structure 1450. Nonmagnetic spacer layer 1440 has the same properties, construction and characteristics as nonmagnetic spacer layers 340, 540 and 740, discussed above. MTJ 1430 is placed over nonmagnetic spacer layer 1440. MTJ 1430 is generally constructed of free layer 1436 (which is placed over nonmagnetic spacer layer 1440) and reference layer 1432. Free layer 1436 and reference layer 1432 are spatially separated from each other by tunneling barrier layer 1434, which is made of an insulating material such as MgO or W. As above, MTJ 1430 as a perpendicular MTJ in that the magnetic direction of both reference layer and free layer are perpendicular to their respective planes. As discussed with respect to other embodiments, free magnetic layer 1436 design may include magnetization of the free layer 1436 pointing a few degrees away from its perpendicular axis. The tilted angle of the free layer magnetization can be due to interaction with the PSC magnetic layer 1450 or due to magnetocrystalline anisotropy, will additionally help switching of the free layer magnetization by improving the initiation of the switching. Ferromagnetic coupling layer 1428 is placed over reference layer 1432. A synthetic antiferromagnetic (SAF) layer 1426 is disposed over ferromagnetic coupling layer 1428. An antiferromagnetic coupling layer 1424 is placed over SAF layer 1426. Another synthetic antiferromagnetic layer 1422 is placed over antiferromagnetic coupling layer 1424. Note that SAF layer 1426 technically also includes ferromagnetic coupling layer 1428 and reference layer 1432, but are shown separately here for explanation purposes. SAF layers 1426 and 1422 also have perpendicular magnetic directions under normal operating conditions. Finally, capping layer 1420 is placed over SAF layer 1422. Current can be provided by a current source 1475. Other than the ordering of the layers, magnetic device operates in the same manner as described with respect to the embodiment shown in FIGS. 5, 7 and 9. Thus, just as shown in FIGS. 5, 7 and 9, PSC magnetic structure 1450 rotates in such a way that spin transfer torque 310 is applied in a beneficial manner throughout the entire precession cycle of free layer 1436.

All of the layers of devices 300, 500, 700 and 1400 illustrated in FIGS. 5, 7, 9 and 14 can be formed by a thin film magnetron sputter deposition system as would be appreciated by one skilled in the art. The thin film sputter deposition system can include the necessary physical vapor deposition (PVD) chambers, each having one or more targets, an oxidation chamber and a sputter etching chamber. Typically, the sputter deposition process involves a sputter gas (e.g., argon, krypton, xenon or the like) with an ultra-high vacuum and the targets can be made of the metal or metal alloys to be deposited on the substrate. Thus, when the present specification states that a layer is placed over another layer, such layer could have been deposited using such a system. Other methods can be used as well. It should be appreciated that the remaining steps necessary to manufacture MTJ stacks 300, 500, 700 and 1300 are well-known to those skilled in the art and will not be described in detail herein so as not to unnecessarily obscure aspects of the disclosure herein.

It should be appreciated to one skilled in the art that a plurality of MTJ structures 300, 500, 700 and 1300 can be manufactured and provided as respective bit cells of an STT-MRAM device. In other words, each MTJ stack 300, 500, 700 and 1400 can be implemented as a bit cell for a memory array having a plurality of bit cells.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:

1. A magnetic device, comprising
   a precessional spin current magnetic structure in a first plane, the precessional spin current magnetic structure having a magnetization vector with a magnetization direction in the first plane which can freely rotate in any magnetic direction in the first plane, the precessional spin current magnetic structure comprising a first precessional spin current ferromagnetic layer, a nonmagnetic precessional spin current insertion layer and a second precessional spin current ferromagnetic layer, the nonmagnetic precessional spin current insertion layer being disposed over the first precessional spin current ferromagnetic layer, and the second precessional spin current ferromagnetic layer being disposed over the nonmagnetic precessional spin current insertion layer, wherein the nonmagnetic precessional spin current insertion layer is constructed of a thin film of Ru or another nonmagnetic material having a long spin diffusion length;
   a nonmagnetic spacer layer in a second plane and disposed over the precessional spin current magnetic structure, the non-magnetic spacer layer comprising MgO;
   a free magnetic layer in a third plane and disposed over the nonmagnetic spacer layer, the free magnetic layer having a magnetization vector that is perpendicular to the third plane and having a magnetization direction that can precess from a first magnetization direction to a second magnetization direction, wherein the free magnetic layer has its easy axis magnetization axis points away from the perpendicular direction to form a tilted angle with respect to the perpendicular plane due to the magnetocrystalline anisotropy of the free magnetic layer, where the tilted angle is a result of the crystalline structure of the free magnetic layer;
   a nonmagnetic tunnel barrier layer in a fourth plane and disposed over the free magnetic layer; and
   a synthetic antiferromagnetic structure in a fifth plane, the synthetic antiferromagnetic structure including a magnetic reference layer, the magnetic reference layer having a magnetization vector that is perpendicular to the fifth plane and having a fixed magnetization direction, the magnetic reference layer, the nonmagnetic tunnel barrier layer and the free magnetic layer forming a magnetic tunnel junction.

2. The magnetic device of claim 1, wherein the nonmagnetic precessional spin current insertion layer is constructed of a material having a spin diffusion length exceeding 5 nanometers.

3. The magnetic device of claim 1, wherein the thin film of Ru has a thickness of at least one nanometer.

4. The magnetic device of claim 1, wherein the thin film of Ru has a thickness of 1.5 nanometers.

5. The magnetic device of claim 1, wherein the first precessional spin current ferromagnetic layer comprises a thin film of Fe, the nonmagnetic precessional spin current insertion layer comprises a material with a long spin diffusion length, and the second precessional spin current ferromagnetic layer comprises a thin film of CoFeB, Co, Fe, Ni or their alloys.

6. The magnetic device of claim 5, wherein the thin film of Fe has a thickness of 0.5 to 2 nanometers.

7. The magnetic device of claim 6, wherein the thin film of Fe has a thickness of 0.4 nanometers.

8. The magnetic device of claim 6, wherein the thin film of Fe has a thickness of 0.6 nanometers.

9. The magnetic device of claim 5, wherein the thin film of CoFeB is comprised of forty percent Co, forty percent Fe and twenty percent B.

10. The magnetic device of claim 5, wherein the thin film of CoFeB, Co, Fe, Ni or their alloys has a thickness of 1 to 5 nanometers.

11. The magnetic device of claim 10, wherein the thin film of CoFeB, Co, Fe, Ni or their alloys has a thickness of 1.7 nanometers.

12. The magnetic device of claim 10, wherein the thin film of CoFeB, Co, Fe, Ni or their alloys has a thickness of 1.85 nanometers.

13. The magnetic device of claim 5, wherein the material with a long spin diffusion length is selected from the group consisting of Ru, Cu, Ag, Au, Mg and Al.

14. The magnetic device of claim 1, wherein the free magnetic layer comprises two magnetic layers and a tungsten layer between the two magnetic layers.

15. The magnetic device of claim 14, wherein the tungsten layer has a thickness of 0.1 to 1 nanometer.

16. The magnetic device of claim 14, wherein each of the two magnetic layers comprises a thin film of CoFeB.

17. The magnetic device of claim 16, wherein the thin film of CoFeB has a thickness of 0.5 to 1.5 nanometers.

18. The magnetic device of claim 1, wherein the magnetic reference layer comprises a tungsten layer and a magnetic layer.

19. The magnetic device of claim 18, wherein the magnetic layer comprises a thin film of CoFeB comprised of sixty percent Fe, twenty percent Co and twenty percent B.

20. The magnetic device of claim 1, wherein electrons of an electrical current passing through the precessional spin current magnetic structure are aligned in the magnetic direction of the precessional spin current magnetic structure and injected into the nonmagnetic spacer, the free magnetic layer, the nonmagnetic tunnel barrier layer, and the magnetic reference layer, and wherein the magnetization direction of the precessional spin current magnetic structure precesses and is free to follow precession of the magnetization direction of the free magnetic layer, thereby causing spin transfer torque to assist switching of the magnetization vector of the free magnetic layer.

* * * * *